(12) United States Patent
Chi

(10) Patent No.: US 9,361,953 B2
(45) Date of Patent: Jun. 7, 2016

(54) MEMORY AND MEMORY SYSTEM INCLUDING THE SAME

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 227 days.

(21) Appl. No.: 14/109,437

(22) Filed: Dec. 17, 2013

(65) Prior Publication Data

US 2015/0049567 A1 Feb. 19, 2015

(30) Foreign Application Priority Data

Aug. 14, 2013 (KR) ........................ 10-2013-0096435

(51) Int. Cl.
| | |
|---|---|
| *G11C 7/00* | (2006.01) |
| *G11C 7/02* | (2006.01) |
| *G11C 11/406* | (2006.01) |
| *G11C 11/408* | (2006.01) |
| *G11C 29/00* | (2006.01) |

(52) U.S. Cl.
CPC ............... *G11C 7/02* (2013.01); *G11C 11/408* (2013.01); *G11C 11/40622* (2013.01); *G11C 29/783* (2013.01); *G11C 2211/4065* (2013.01)

(58) Field of Classification Search
CPC .. G11C 7/02; G11C 11/40622; G11C 11/408; G11C 2211/4065
USPC ........................ 365/222, 200, 230.03, 230.06
See application file for complete search history.

(56) References Cited

U.S. PATENT DOCUMENTS

| | | | | | |
|---|---|---|---|---|---|
| 6,078,543 | A | * | 6/2000 | Kim ..................... | G11C 11/406 365/222 |
| 7,573,763 | B2 | * | 8/2009 | Im ........................ | G11C 29/785 365/200 |
| 8,902,687 | B2 | * | 12/2014 | Hosoe ................... | G11C 29/04 365/200 |
| 2005/0254321 | A1 | * | 11/2005 | Okuyama ............ | G11C 11/406 365/200 |
| 2014/0063995 | A1 | * | 3/2014 | Song ....................... | G11C 8/14 365/200 |

FOREIGN PATENT DOCUMENTS

| | | |
|---|---|---|
| KR | 95-28551 | 10/1995 |
| KR | 1020050095980 | 10/2005 |

* cited by examiner

*Primary Examiner* — Toan Le
(74) *Attorney, Agent, or Firm* — IP & T Group LLP

(57) ABSTRACT

A memory includes a first cell block comprising a plurality of first word lines and one or more first redundancy word lines for replacing at least one of the plurality of first word lines; a second cell block comprising a plurality of second word lines and one or more second redundancy word lines for replacing at least one of the plurality of second word lines; and a control unit suitable for sequentially receiving one or more input addresses, during a target refresh section, selecting one of the first cell block and the second cell block and a word line included in the selected cell block in response to a first input address, and activating one or more adjacent word lines adjacent to the selected word line, which is selected based on the first input address, when the selected word line is adjacent to the redundancy word line, wherein the adjacent word lines comprise the redundancy word line.

28 Claims, 14 Drawing Sheets

US 9,361,953 B2
MEMORY AND MEMORY SYSTEM INCLUDING THE SAME

CROSS-REFERENCE TO RELATED APPLICATION

The present application claims priority of Korean Patent Application No. 10-2013-0096435, filed on Aug. 14, 2013, which is incorporated herein by reference in its entirety.

BACKGROUND

1. Field

Exemplary embodiments of the present invention relate to memory and a memory system including the same.

2. Description of the Related Art

A memory cell of a memory includes a transistor serving as a switch and a capacitor that may store charges, i.e., data. Whether data is high (logic "1") or low (logic "0") is determined by whether or not charges are present in the capacitor of the memory cell, that is, whether or not a potential between both terminals of the capacitor is high or low.

The data stored in the capacitor is in the form of an accumulated electrical charge. Ideally there is no power consumption of the stored electrical charge. Since leakage current occurs due to a PN junction of a metal oxide semiconductor (MOS) transistor, the amount of charges initially stored in the capacitor is lost, thus the stored data may be lost. To prevent such a loss, the data within the memory cell needs to be read before the data is lost, and a normal amount of charges needs to be recharged based on the read information. The memory of the data remains intact only when such an operation is periodically repeated. Such a recharging process of cell charges is called a refresh operation.

FIG. 1 is a diagram illustrating a section of a cell array included in a memory for describing a word line disturbance.

Referring to FIG. 1, "WLK−1", "WLK", and "WLK+1" are three word lines that are disposed in parallel. The word line WLK indicated by "HIGH_ACT" is a frequently activated word line having a large number of activation times or a high activation frequency, and the word lines WLK−1 and WLK+1 are adjacent word lines adjacent to WLK, "CELL_K−1" "CELL_K", and "CELL_K+1" are memory cells coupled with the respective word lines WLK−1, WLK, and WLK+1. The memory cells CELL_K−1, CELL_K and CELL_K+1 include respective cell transistors TR_K−1, TR_K and TR_K+1 and respective cell capacitors CAP_K−1, CAP_K, and CAP_K+1. For reference, 'BL' and 'BL+1.' indicate a bit line.

When the frequently activated word line WLK is activated and precharged, voltages of the adjacent word lines WLK−1 and WLK+1 increase or decrease due to a coupling phenomenon occurring between the frequently activated word line WLK and the adjacent word lines WLK−1 and WLK+1. Accordingly, the amount of charges stored in the cell capacitors CAP_K−1, CAP_K, and CAP_K+1 is affected. If the frequently activated word line WLK toggles between an active state and a precharge state, data stored in the memory cells CELL_K−1 and CELL_K+1 may be lost due to a change in the amount of charges stored in the cell capacitors CAP_K−1 and CAP_K+1.

Furthermore, data stored in memory cells coupled with adjacent word lines may be damaged because electromagnetic waves generated when a word line toggles between an active state and a precharge state induce and drain electrons stored in the cell capacitors of the memory cells.

SUMMARY

Various exemplary embodiments of the present invention are directed to a memory and memory system for preventing data stored in memory cells coupled with word lines adjacent to a frequently activated word line from being damaged by refreshing the adjacent word lines.

Also, various exemplary embodiments of the present invention are directed to a memory and memory system for preventing data stored in memory cells coupled with adjacent word lines from being damaged when a frequently activated word line is a redundancy word line replaced for a normal word line.

In accordance with an exemplary embodiment of the present invention, a memory may include a first cell block comprising a plurality of first word lines and one or more first redundancy word lines for replacing at least one of the plurality of first word lines; a second cell block comprising a plurality of second word lines and one or more second redundancy word lines for replacing at least one of the plurality of second word lines; and a control unit suitable for sequentially receiving one or more input addresses, during a target refresh section, selecting one of the first cell block and the second cell block and a word line included in the selected cell block in response to a first input address, and activating one or more adjacent word lines adjacent to the selected word line, which is selected based on the first input address, when the selected word line is adjacent to a redundancy word line, wherein the adjacent word lines comprise the redundancy word line.

In accordance with an exemplary embodiment of the present invention, a memory system may include a memory comprising a first cell block including a plurality of first word lines and one or more first redundancy word lines, and a second cell block including a plurality of second word lines and one or more second redundancy word lines, the memory suitable for selecting one of the first and second cell blocks and a word line included in the selected cell block in response to a first input address inputted during a target refresh section, and activating one or more adjacent word lines adjacent to the selected word line, which is selected based on the first input address, in the selected cell block when the selected word line is adjacent to the redundancy word line, wherein the adjacent word lines comprise the redundancy word line; and a memory controller suitable for controlling the memory to enter the target refresh section when a word line on which target refresh is to be performed is detected, and transmitting one or more addresses for selecting the word line on which target refresh is to be performed to the memory during the target refresh section.

In accordance with an exemplary err embodiment of the present invention, a memory may include a first cell block comprising a plurality of first word line groups and one or more first redundancy word line groups replacing at least one of the plurality of first word line groups, wherein each of the first word line groups comprises two or more first word lines, and each of the first redundancy word line groups comprises two or more first redundancy word lines; a second cell block comprising a plurality of second word line groups and one or more second redundancy word line groups replacing at least one of the plurality of second word line groups, wherein each of the second word line groups comprises two or more first word lines, and each of the second redundancy word line groups comprises two or more first redundancy word lines; and a control unit suitable for sequentially receiving one or more input addresses, during a target refresh section, selecting one of the first cell block and the second cell block and a word line included in the selected cell block in response to a first input address, and activating one or more adjacent word lines adjacent to the selected word line, which is selected based on the first input address, when the selected word line is adjacent to the redundancy word line during the target refresh section, wherein the adjacent word lines comprise the redundancy word line.

DETAILED DESCRIPTION

Figure 1:
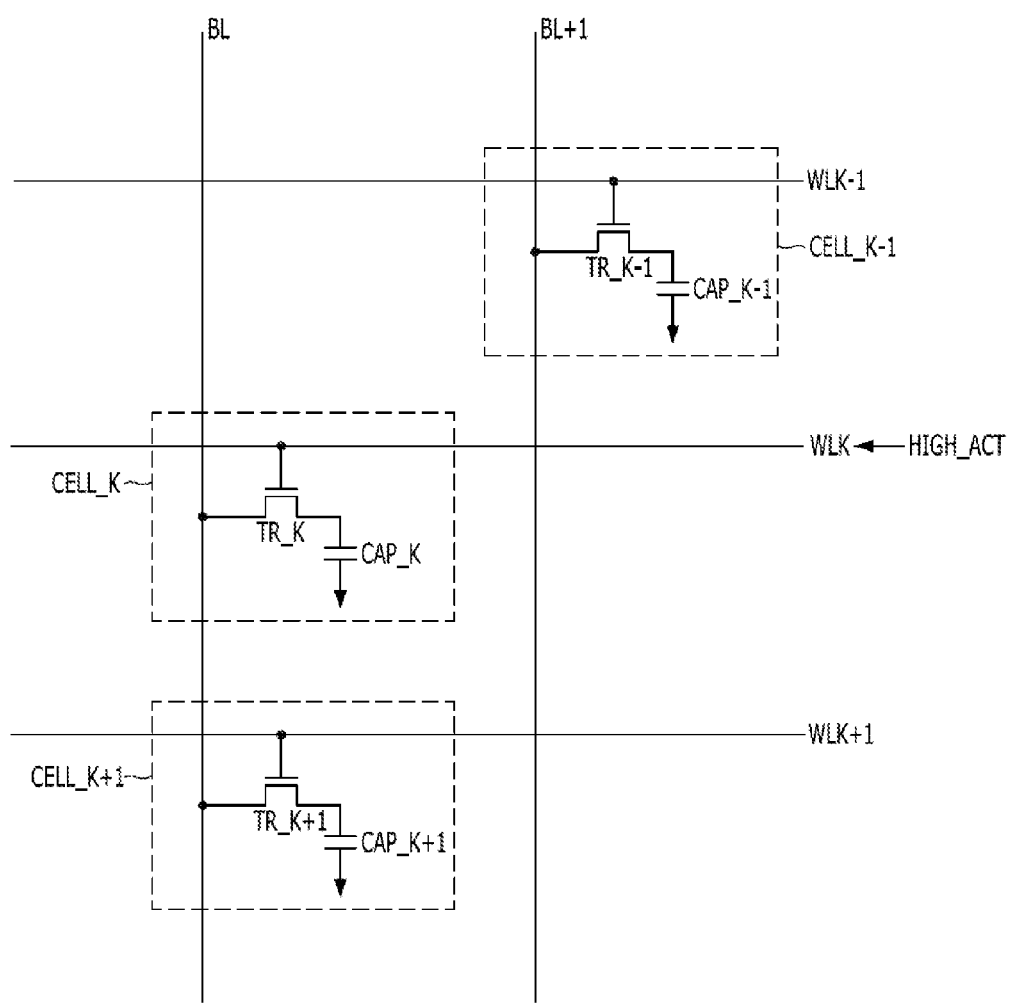
FIG. 1 is a diagram illustrating a section of a cell array included in memory for describing a word line disturbance.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereinafter, when a word line is activated in response to an active command in a target refresh operation, a memory cell coupled with the activated word line is refreshed. Furthermore, the refreshing of a word line may mean that memory cells coupled with the refreshed word line are refreshed.

Furthermore, a frequently activated word line may refer to a word line which has the activation number equal to or greater than a reference number, or an activation frequency that, satisfies a specific condition, for example, higher than a reference frequency. An adjacent word line may refer to a word line coupled with memory cells that are disposed adjacent to the frequently activated word line and whose data is influenced by an active or precharge operation of the frequently activated word line.

Figure 2:
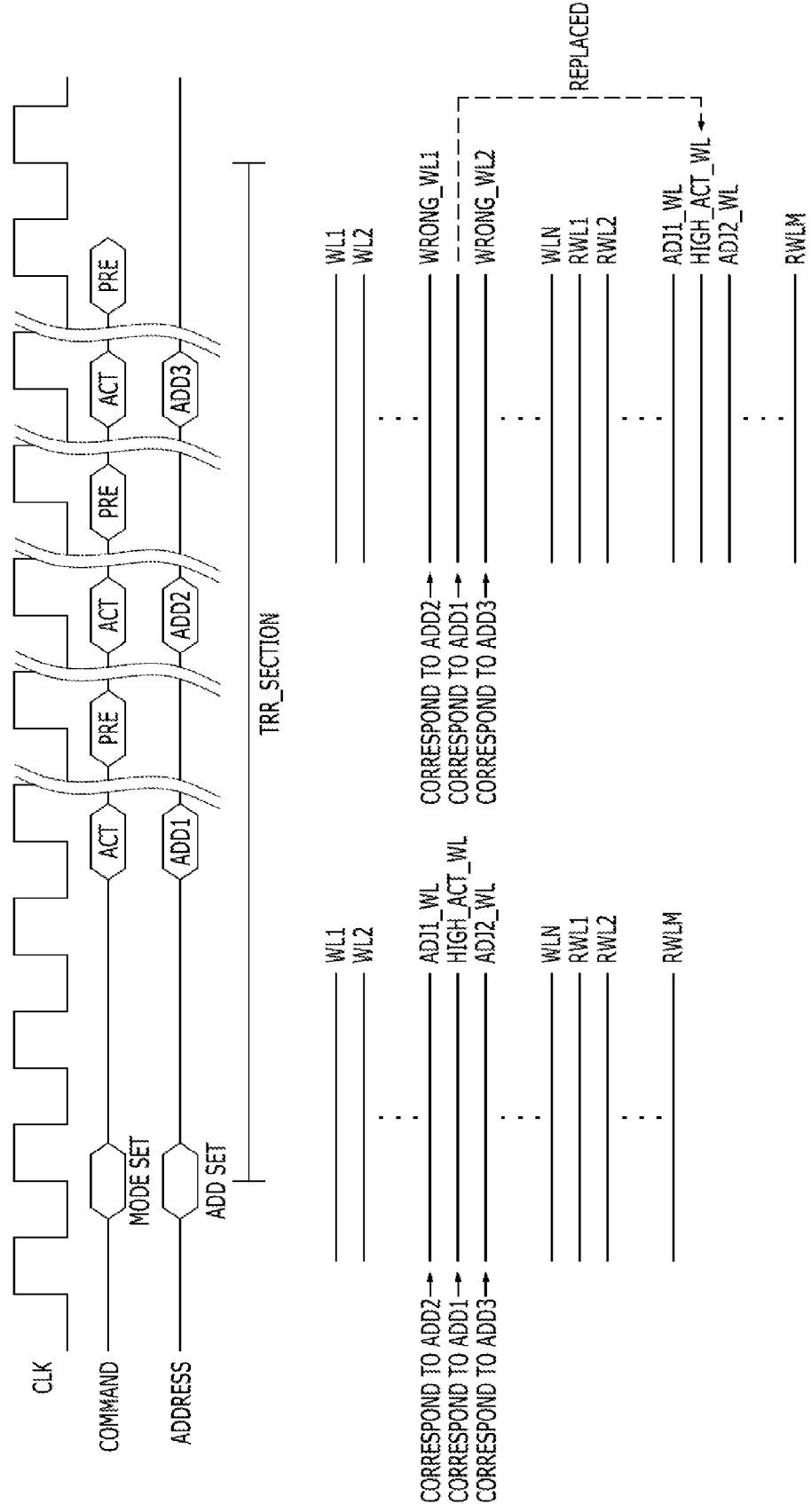
FIG. 2 is a timing diagram illustrating a target refresh operation for refreshing adjacent word lines adjacent to a frequently activated word line.

FIG. 2 is a timing diagram illustrating a target refresh operation for refreshing adjacent word lines adjacent to a frequently activated word line.

Referring to FIG. 2, commands MODE_SET, ACT, and PRE, and addresses ADD1 to ADD3 and ADD_SET may be inputted in synchronism with a clock signal CLK.

A memory may include a plurality of word lines WL1 to WLN each coupled to a plurality of memory cells (not shown) and one or more redundancy word lines RWL1 to RWLM.

When a frequently activated word line HIGH_ACT_WL is detected, a memory controller (not shown) may apply the command MODE_SET for setting a mode of the memory. The command MODE_SET may include a mode register set (MRS) command of the memory. The memory controller may apply an address ADD_SET to the memory, along with the command MODE_SET. In response to the address ADD_SET and the command MODE_SET, the memory may enter a target refresh section TRR_SECTION.

After the memory enters the target refresh section TRR_SECTION, the memory controller may sequentially apply the active command ACT and the precharge command PRE to the memory and also apply an address ADD1 corresponding to the frequently activated word line HIGH_ACT_WL and addresses ADD2 and ADD3 for selecting adjacent word lines ADJ1_WL and ADJ2_WL, respectively, to the memory.

As shown in FIG. 2 on the left side, if the frequently activated word line HIGH_ACT_WL is one of the plurality of word lines WL1 to WLN, when the addresses ADD2 and ADD3 are applied to the memory, the adjacent word lines ADJ1_WL and ADJ2_WL are selected, activated, and precharged, thus the target refresh operation is normally performed.

As shown in FIG. 2 on the right side, if the frequently activated word line HIGH_ACT_WL is any one of the redundancy word lines RWL1 to RWLM due to a replacement of a normal word line, when the addresses ADD2 and ADD3 are applied to the memory, wrong word lines WRONG_WL1 and WRONG_WL2 are selected, not the adjacent word lines ADJ1_WL and ADJ2_WL adjacent to the frequently activated word line HIGH_ACT_WL, thus the target refresh operation is abnormally performed.

There is a need for a method for normally performing a target refresh operation on redundancy word lines because such redundancy word lines may not be selected in response to addresses externally received from the memory.

Figure 3:
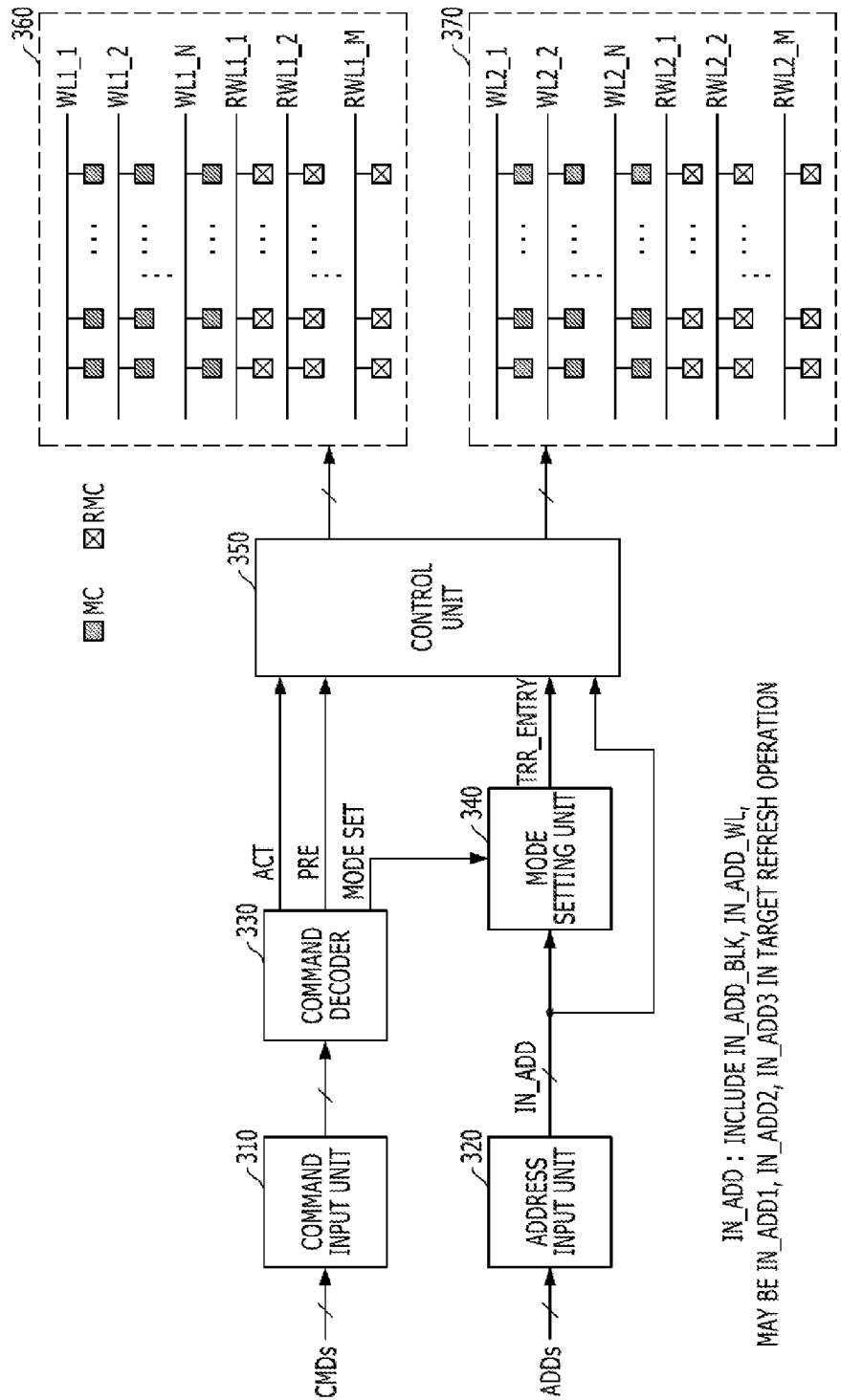
FIG. 3 is a block diagram illustrating a memory in accordance with an exemplary embodiment according to the present invention.

FIG. 3 is a block diagram illustrating a memory in accordance with an exemplary embodiment according to the present invention.

As shown in FIG. 3, the memory may include a command input unit 310, an address input unit 320, a command decoder 330, a mode setting unit 340, a control unit 350, a first cell block 360, and a second cell block 370. FIG. 3 illustrates elements related to an active operation and a target refresh operation in the memory, except for elements related to the other operations such as a read operation, a write operation, and the like.

Referring to FIG. 3, the command input unit 310 may receive commands CMDs from a memory controller (not shown), and the address input unit 320 may receive addresses ADDs from the memory controller. Each of the commands CMDs and the addresses ADDs may include signals of multiple bits.

The command decoder 330 may generate an active command ACT, a precharge command PRE, and a mode set command MODE_SET by decoding the commands CMDs received from the command input unit 310. The command decoder 330 may activate the active command ACT if a combination of the received command signals CMDs indicates the active command ACT, activate the precharge command PRE if a combination of the received command signals CMDs indicates the precharge command PRE, and activate the mode set command MODE_SET if a combination of the received command signals CMDs indicates the mode set command MODE_SET. In addition, the command decoder 330 may generate commands for refresh, read, and write operations by decoding the received command signals CMDs, but the description and illustration thereof are omitted since it does not have a direction relation with the memory in accordance with the exemplary embodiment.

The mode setting unit 340 may activate an entry signal TRR_ENTRY in response to input addresses IN_ADD when the mode set command MODE_SET is activated.

The first cell block 360 may include a plurality of first word lines WL1_1 to WL1_N, each coupled to one or more memory cells MC, and one or more first redundancy word lines RWL1_1 to RWL1_M, each coupled with one or more redundancy memory cells RMC, for replacing one or more of the plurality of first word lines WL1_1 to WL1_N. As shown in FIG. 3, in the first cell block 360, the plurality of first word lines WL1_1 to WL1_N may be sequentially disposed, and the first redundancy word lines RWL1_1 to RWL1_M may be sequentially disposed next to the last first word line WL1_N.

The second cell block 370 may include a plurality of second word lines WL2_1 to WL2_N each coupled to one or more memory cells MC, and one or more second redundancy word lines RWL2_1 to RWL2_M, each coupled with one or more redundancy memory cells RMC, for replacing one or more of the plurality of second word lines WL2_1 to WL2_N. As shown in FIG. 3, in the second cell block 370, the plurality of second word lines WL2_1 to WL2_N may be sequentially disposed, and the second redundancy word lines RWL2_1, to RWL2_M may be sequentially disposed next to the last second word line WL2_N.

Each of the first and the second cell blocks 360 and 370 includes a plurality of bit lines, and the memory cell MC is coupled with a bit line and a word line. In FIG. 3, a bit line is not shown.

The control unit 350 may select a cell block and a word line and may activate and precharge the selected word line in the selected cell block. The operations of the control unit 350 are described below in connection with a common active operation and an active operation in a target refresh section.

Common Active Operation

When the active command ACT is activated, the control unit 350 may activate a word line selected based on the input addresses IN_ADD received from the address input unit 320. The control unit 350 may select a cell block corresponding to the input addresses IN_ADD from the first cell block 360 and the second cell block 370. If a word line corresponding to the input addresses IN_ADD has not been replaced in the selected cell block, the control unit 350 may select a word line corresponding to the input addresses IN_ADD. If a word line corresponding to the input addresses IN_ADD has been replaced, the control unit 350 may select a redundancy word line that has replaced the word line corresponding to the input addresses IN_ADD.

When a read or write command is activated in response to external command signals CMDs, the read or write operation of memory cells coupled with an activated word line is performed. When the precharge command PRE is activated after the read or write operation is completed, the control unit 350 may precharge the activated word line.

Target Refresh Operation

In a target refresh operation, the memory may refresh one or more adjacent word lines adjacent to a word line that is selected based on a first input address IN_ADD1. Hereinafter, one or more adjacent word lines may include a first adjacent word line and a second adjacent word line. If the word line selected based on the first input address IN_ADD1 is a word line disposed at a $k^{th}$ in a cell block, the first adjacent word line may be a word line disposed at a $(k-1)^{th}$ in the cell block, and the second adjacent word line may be a word line disposed at a $(k+1)^{th}$ in the cell block.

When the mode set command MODE_SET is activated, the mode setting unit 340 may set an operation mode of the memory based on a combination of the input addresses IN_ADD. If a combination of the input addresses IN_ADD corresponds to a target refresh operation, the mode setting unit 340 may activate the entry signal TRR_ENTRY. When the entry signal TRR_ENTRY is activated, the memory may enter a target refresh section. A method of the memory entering the target refresh section may vary depending on the design, and the memory may enter the target refresh section using a command decoded from external command signals CMDs.

After the memory enters the target refresh section, the active command ACT may be activated three times in response to the external command signals CMDs. First to third input addresses IN_ADD1, IN_ADD2, and IN_ADD3, together with the command signals CMDs, may be sequentially inputted. The second and the third input addresses IN_ADD2 and IN_ADD3 may have values corresponding to word lines that are adjacent to a word line corresponding to the first input address IN_ADD1. That is, if the first input address IN_ADD1 corresponds to the word line disposed at the $k^{th}$ in the cell block, the second input address IN_ADD2 may correspond to the word line disposed at the $(k-1)^{th}$ in the cell block, and the third input address IN_ADD3 may correspond to the word line disposed at the $(k+1)^{th}$ in the cell block.

During the target refresh section, the control unit 350 may select a cell block corresponding to the first input address IN_ADD1 from the first cell block 360 and the second cell block 370. That is, during the target refresh section, the control unit 350 may maintain a state in which the cell block corresponding to the first input address IN_ADD1 has been selected, irrespective of the second and the third input addresses IN_ADD2 and IN_ADD3.

When the active command ACT is first activated in the target refresh section, the control unit 350 may activate a word line selected based on the first input address IN_ADD1 in the selected cell block. Thereafter, when the precharge command PRE is activated, the control unit 350 may precharge the activated word line.

The word line selected based on the first input address IN_ADD1 may indicate a word line corresponding to the first input address IN_ADD1 if the word line corresponding to the first input address IN_ADD1 has not be replaced in the selected cell block. The word line selected based on the first input address IN_ADD1 may indicate a redundancy word line that has replaced a word line corresponding to the first input address IN_ADD1 if the word line corresponding to the first input address IN_ADD1 has been replaced in the selected cell block.

The following operation is an example of when a word line selected based on the first input address IN_ADD1 is not adjacent to a redundancy word line i.e., the word line one of word lines WL1_1 to WL1_N-1 and WL2_1 to WL2_N-1.

When the active command ACT is activated second and third in the target refresh section, the control unit 350 may activate word lines corresponding to the second and the third input addresses IN_ADD2 and IN_ADD3. When the precharge command PRE is activated, the activated word lines are precharged. The word lines corresponding to the second and the third input addresses IN_ADD2 and IN_ADD3 are respective first and second adjacent word lines.

Although word lines corresponding to the second and the third input addresses IN_ADD2 and IN_ADD3 have been replaced, the control unit 350 may not activate redundancy word lines that have replaced the word lines corresponding to the second and the third input addresses IN_ADD2 and IN_ADD3. The redundancy word lines that have replaced the word lines corresponding to the second and the third input addresses IN_ADD2 and IN_ADD3 are not adjacent to the word line corresponding to the first input address IN_ADD1.

The following operation is an example of when a word line selected based on the first input address IN_ADD1 is adjacent to a redundancy word line i.e., the word line is one of word lines WL1_N, RWL1_1 to RWL1_M, WL2_N, and RWL2_1 to RWL2_M.

When the active command ACT is activated second and third in the target refresh section, the control unit 350 may activate the first adjacent word line and the second adjacent word line as follows.

If a word line selected based on the first input address IN_ADD1 is the word line WL1_N or WL2_N that is last disposed in the cell block, when the active command ACT is activated second, the control unit 350 may activate the word line WL1_N-1 or WL2_N-1 i.e., a first adjacent word line, disposed ahead of a word line that is last disposed in the cell block based on the second input address IN_ADD2. Thereafter, when the precharge command PRE is activated, the control unit 350 may precharge the activated word line.

When the active command ACT is activated third, the control unit 350 may activate the redundancy word line RWL1_1 or RWL2_1 i.e., the second adjacent word line, that is first disposed in the cell block irrespective of the third input address IN_ADD3. Thereafter, when the precharge command PRE is activated, the control unit 350 may precharge the activated word line.

If a word line selected based on the first input address IN_ADD1 is a redundancy word line in the cell block, when the active command ACT is activated second and third, the control unit 350 may activate a first adjacent word line and a second adjacent word line irrespective of the second and the third input addresses IN_ADD2 and IN_ADD3. Thereafter, when the precharge command PRE is activated, the control unit 350 may precharge the activated word lines.

If a word line selected based on the first input address IN_ADD1 is the redundancy word line RWL1_1 or RWL2_1 that is first disposed in the cell block, a first adjacent word line may be the word line or WL1_N or WL2_N that is last disposed in the cell block, and a second adjacent word line may be the redundancy word line RWL1_1 or RWL2_1 that is second disposed in the cell block.

If a word line selected based on the first input address IN_ADD1 is a redundancy word line that is second disposed in the cell block i.e., one of the word lines RWL1_2 to RWL1_M or one of the word lines RWL2_2 to RWL2_M, a first adjacent word line may be a redundancy word line disposed ahead of the selected word line, and a second adjacent word line may be a redundancy word line disposed behind the selected word line.

After all the first adjacent word lines and the second adjacent word lines are refreshed, the control unit 350 may terminate the target refresh section.

If a word line selected based on the first input address IN_ADD1 is a redundancy word line, the memory may directly refresh a first adjacent word line and a second adjacent word line without using the second input address IN_ADD2 and the third input address IN_ADD3. Accordingly, although a word line corresponding to the first input address IN_ADD1 has been replaced, the memory may normally perform a target refresh operation. Furthermore, although an address corresponding to another cell block is received, the memory may perform a target refresh operation on a normally selected cell block because a cell block selected based on the first input address IN_ADD1 remains selected during the target refresh operation.

Figure 4:
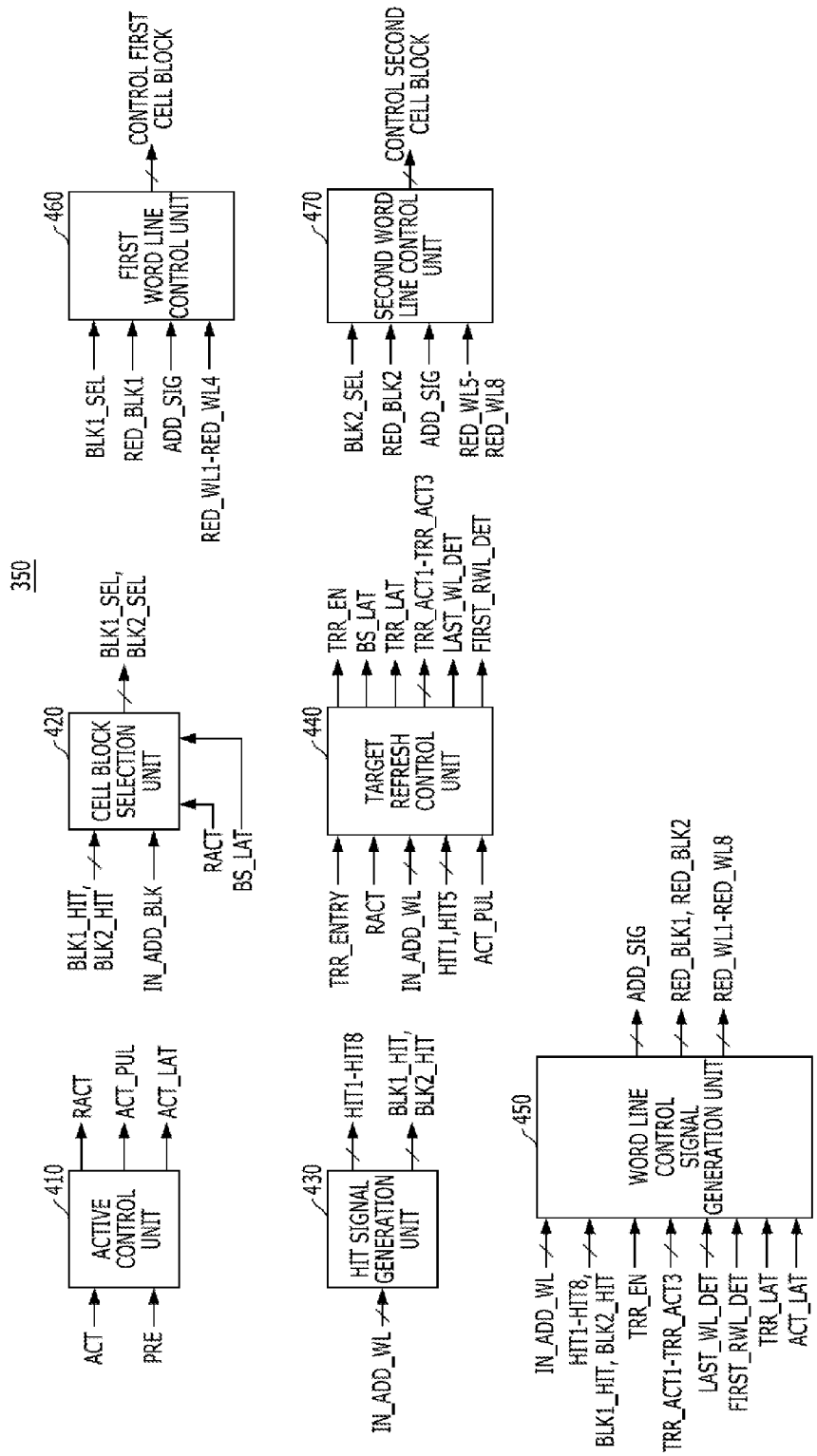
FIG. 4 is a detailed block diagram illustrating a control unit shown in FIG. 3.

FIG. 4 is a detailed block diagram illustrating the control unit 350 shown in FIG. 3.

As shown in FIG. 4, the control unit 350 may include an active control unit 410, a cell block selection unit 420, a hit signal generation unit 430, a target refresh control unit 440, a word line control signal generation unit 450, a first word line control unit 450, and a second word line control unit 470. Hereinafter, the input addresses IN_ADD may include one or more bits IN_ADD_BLK for selecting a cell block and one or more bits IN_ADD_WL, for selecting a word line.

The operation of the control unit 350 is described with reference to FIG. 4.

The active control unit 410 may generate an active signal RACT to control activation and precharge operations of a cell block that is selected from the first cell block 360 and the second cell block 370. The active control unit 410 may activate the active signal RACT when the active command ACT is activated and may deactivate the active signal RACT when the precharge command PRE is activated. The active control unit 410 may generate an active pulse signal ACT_PUL. The active pulse signal ACT_PUL is a pulse signal that is activated after a lapse of a specific time since the active command ACT is activated.

The cell block selection unit 420 may select a cell block, corresponding to one or more bits IN_ADD_BLK of an input address IN_ADD, from the first cell block 360 and the second cell block 370, and may select a cell block corresponding to the first input address IN_ADD1 during a target refresh section.

The cell block selection unit 420 may activate a first block signal BLK1_SEL when the first cell block 360 is selected, and may activate a second block signal BLK2_SEL when the second cell block 370 is selected.

When the active signal RACT is deactivated, the cell block selection unit 420 may deactivate both the block signals BLK1_SEL and BLK2_SEL. When a block selection latch signal BS_LAT is deactivated, the cell block selection unit 420 may activate one of the first and second block signals BLK1_SEL and BLK2_SEL in response to the input address IN_ADD_BLK, or an activated one of first and second block hit signals BLK1_HIT and BLK2_HIT, during an activation section of the active signal RACT.

The cell block selection unit 420 may activate one of the first and second block signals BLK1_SEL and BLK2_SEL in response to the input address IN_ADD_BLK that is received at a point in time at which the block selection latch signal BS_LAT is activated, or in response to the first and second block hit signals BLK1_HIT and BLK2_HIT that are activated at the point in time, during the activation section of the block selection latch signal BS_LAT. The block selection latch signal BS_LAT may be activated when the first active command ACT is activated in the target refresh section, and may be deactivated when the target refresh section is terminated. Accordingly, when the active command ACT is first activated in the target refresh operation, the cell block selection unit 420 may activate one of the first and second block signals BLK1_SEL and BLK2_SEL in response to the first input address IN_ADD1. When the target refresh section is terminated, the cell block selection unit 420 may deactivate the activated block signal.

The hit signal generation unit 430 may generate a plurality of hit signals BLK1_HIT, BLK2_HIT, and HIT1 to HIT8 in response to one or more bits IN_ADD_WL of the input addresses IN_ADD. The hit signal generation unit 430 may store one or more fail addresses, compare each of the input addresses IN_ADD_WL with each of the stored fail addresses, and activate one of the first to eighth hit signals HIT1 to HIT8 when the fail address is identical to the input addresses IN_ADD_WL.

An example in which four redundancy word lines (M=4) are present in each cell block is described below. The first to fourth hit signals HIT1 to HIT4 may correspond to one or more first redundancy word lines RWL1_1 to RWL1_M, and the fifth to eighth hit signals HIT5 to HIT8 may correspond to one or more second redundancy word lines RWL2_1 to RWL2_M. For reference, the fail address may be an address of a word line from which a defect has been detected during a memory fabrication process.

The hit signal generation unit 430 may activate the first block hit signal BLK1_HIT when any of the first to fourth hit signals HIT1 to HIT4 is activated, and may activate the second block hit signal BLK2_HIT when any of the fifth to eighth hit signals HIT5 to HIT8 is activated.

The target refresh control unit 440 may generate various types of control signals such as a section signal TRR_EN, the block selection latch signal BS_LAT, a latch signal TRR_LAT, first to third target active signals TRR_ACT1 to TRR_ACT3, a first detection signal LAST_WL_DET, and a second detection signal FIRST_RWL_DET necessary to perform the target refresh operation.

When the entry signal TRR_ENTRY is activated, the target refresh control unit 440 may activate the section signal TRR_EN denoting the target refresh section. When the active signal RACT is activated three times after the target refresh section is entered the target refresh control unit 440 may deactivate the section signal TRR_EN.

When the active command ACT is first activated after the section signal TRR_EN is activated, the target refresh control unit 440 may activate the block selection latch signal BS_LAT. When the section signal TRR_EN is deactivated, the target refresh control unit 440 may deactivate the block selection latch signal BS_LAT.

The target refresh control unit 440 may sequentially activate the first to third target active signals TRR_ACT1 to TRR_ACT3 denoting respective first, second, and third active operations in the target refresh section. The target refresh control unit 440 may activate the first target active signal TRR_ACT1 during a section in which the active signal RACT is first activated after the section signal TRR_EN is activated, activate the second target active signal TRR_ACT2 during a section in which the active signal RACT is second activated after the section signal TRR_EN is activated, and activate the third target active signal TRR_ACT3 during a section in which the active signal RACT is third activated after the section signal TRR_EN is activated. When the third target active signal TRR_ACT3 is deactivated, the target refresh control unit 440 may deactivate the section signal TRR_EN. The target refresh control unit 440 may activate the latch signal TRR_LAT for a specific time in the first active operation section of the target refresh section. For reference, the latch signal TRR_LAT may be a signal used to latch signals that are inputted or generated in the first active operation.

If a word line selected based on the first input address IN_ADD1 in the target refresh section is the word line WL1_N or WL2_N last disposed in a cell block, the target refresh control unit 440 may activate the first detection signal LAST_WL_DET. If a word line selected based on the first input address IN_ADD1 in the target refresh section is the redundancy word line RWL1_1 or RWL_2_1 first disposed in a cell block, the target refresh control unit 440 may activate the second detection signal FIRST_RWL_DET.

When the section signal TRR_EN and the latch signal TRR_LAT are activated, the target refresh control unit 440 may latch one or more bits IN_ADD_WL in the first input address IN_ADD1. If the bits IN_ADD_WL have a value corresponding to a word line last disposed in a cell block, the target refresh control unit 440 may activate the first detection signal LAST_WL_DET. When the section signal TRR_EN and the latch signal TRR_LAT are activated, the target refresh control unit 440 may latch the first hit signal HIT1 or the fifth hit signal HIT5 corresponding to a redundancy word line first disposed in a cell block and may activate the second detection signal FIRST_RWL_DET when the first hit signal HIT1 or the fifth hit signal HIT5 is activated.

The word line control signal generation unit 450 may generate first and second redundancy signals RED_BLK1 and RED_BLK2, an address signal ADD_SIG, and first to eighth redundancy word line signals RED_WL1 to RED_WL8 for controlling the plurality of word lines to WL1_1 to WL1_N and WL2_1 to WL2_N and the plurality of redundancy word lines RWL1_1 to RWL1_M and RWL2_1 to RWL2_M of a cell block based on the input addresses IN_ADD including one or more bits IN_ADD_WL, the first to eighth hit signals HIT1 to HIT8, the first and second block hit signals BLK1_HIT and BLK2_HIT, the section signal TRR_EN, the first to third target active signals TRR_ACT1 to TRR_ACT3, the latch signal TRR_LAT, an active latch signal ACT_LAT, the first detection signal LAST_WL_DET, and the second detection signal FIRST_RWL_DET.

The word line control signal generation unit 450 transfers one or more bits IN_ADD_WL as the address signal ADD_SIG. When a word line selected based on the first input address IN_ADD1 is the redundancy word line RWL1_1 or RWL2_1 first disposed in a cell block in the target refresh operation, the word line control signal generation unit 450 may output a value corresponding to the word line or WL2_N last disposed in the cell block, as the address signal ADD_SIG.

The word line control signal generation unit 450 latches one or more bits IN_ADD_WL and transfers the bits IN_ADD_WL as the address signal ADD_SIG. However, when the second detection signal FIRST_RWL_DET is activated, the word line control signal generation unit 450 may output a value corresponding to the word line WL1_N or WL2_N last disposed in a cell block, as the address signal ADD_SIG irrespective of the bits IN_ADD_WL during a section in which the second target active signal TRR_ACT2 is activated. The word line WL1_N or WL2_N last disposed in a cell block that is selected in the second active operation may be refreshed by such an operation.

The word line control signal generation unit 450 may transfer the block hit signals BLK1_HIT and BLK2_HIT as the redundancy signals RED_BLK1 and RED_BLK2. In the first active operation, the word line control signal generation unit 450 may latch the block hit signals BLK1_HIT and BLK2_HIT and transfer the latched block hit signals as the redundancy signals RED_BLK1 and RED_BLK2. If a word line selected based on the first input address IN_ADD1 is the redundancy word line RWL1_1 or RWL2_1 first disposed in a cell block, the word line control signal generation unit 450 may deactivate the redundancy signals RED_BLK1 and RED_BLK2 in the second active operation. In other cases, the word line control signal generation unit 450 may transfer the latched block hit signals BLK1_HIT and BLK2_HIT as the redundancy signals RED_BLK1 and RED_BLK2. If a word line selected based on the first input address IN_ADD1 is the word line WL1_N or WL2_N last disposed in a cell block, the word line control signal generation unit 450 may activate the redundancy signals RED_BLK1 and RED_BLK2 and transfer the latched block hit signals BLK1_HIT and BLK2_HIT as the redundancy signals RED_BLK1 and RED_BLK2 in the third active operation.

The word line control signal generation unit 450 transfers the hit signals HIT1 to HIT8 as the respective redundancy word line signals RED_WL1 to RED_WL8, but may latch the hit signals HIT1 to HIT8 in the first active operation of the target refresh section, and generate the redundancy word line signals RED_WL1 to RED_WL8 based on the latched hit signals HIT1 to HIT8 in the second and the third active sections.

When the section signal TRR_EN is deactivated, the word line control signal generation unit 450 may transfer the plurality of hit signals HIT1 to HIT8 so that the plurality of redundancy word line signals RED_WL1 to RED_WL8 are generated. When the section signal TRR_EN is activated, the word line control signal generation unit 450 may receive the plurality of hit signals HIT1 to HIT8 in a state that the latch signal TRR_LAT is activated, and latch the received hit signals HIT1 to HIT8 until the section signal TRR_EN is deactivated.

When the first to third target active signals TRR_ACT1 to TRR_ACT3 are activated, the word line control signal generation unit 450 may generate the plurality of redundancy word line signals RED_WL1 to RED_WL8 as in Table 1.

TABLE 1

|  | Activation section of TRR_ACT1 | Activation section of TRR_ACT2 | Activation section of TRR_ACT3 |
| --- | --- | --- | --- |
| RED_WL1 | Transfer HIT1 | Transfer HIT2 | Deactivate |
| RED_WL2 | Transfer HIT2 | Transfer HIT3 | Transfer HIT1 |
| RED_WL3 | Transfer HIT3 | Transfer HIT4 | Transfer HIT2 |
| RED_WL4 | Transfer HIT4 | Deactivate | Transfer HIT3 |
| RED_WL5 | Transfer HIT5 | Transfer HIT6 | Deactivate |
| RED_WL6 | Transfer HIT6 | Transfer HIT7 | Transfer HIT5 |
| RED_WL7 | Transfer HIT7 | Transfer HIT8 | Transfer HIT6 |
| RED_WL8 | Transfer HIT8 | Deactivate | Transfer HIT7 |

The word line control signal generation unit 450 may transfer each hit signal HITK as the original and corresponding redundancy word line signal RED_WLK when the first target active signal TRR_ACT1 is activated, transfer each hit signal HITK as a redundancy word line signal RED_WLK−1 ahead of the corresponding redundancy word line signal RED_WLK when the second target active signal TRR_ACT2 is activated, and transfer each hit signal HITK as redundancy word line signal RED_WLK+1 behind the corresponding redundancy word line signal RED_WLK when the third target active signal TRR_ACT3 is activated. If there is no hit signal to be transferred, the word line control signal generation unit 450 may deactivate the redundancy word line signal.

If a word line selected based on the first input address IN_ADD1 in the target refresh operation is the word line WL1_N or WL2_N last disposed in a cell block, the word line control signal generation unit 450 may activate the redundancy word line signal RED_WL1 or RED_WL5 corresponding to a redundancy word line first disposed in a cell block irrespective of the hit signals HIT1 to HIT8.

That is, when the first detection signal LAST_WL_DET is activated, the word line control signal generation unit 450 may activate the redundancy word line signal RED_WL1 or RED_WL5 corresponding to a redundancy word line that is first disposed in a cell block irrespective of the hit signals HIT1 to HIT8 during a section in which the third target active signal TRR_ACT3 is activated. In this case, the redundancy word line RWL1_1 or RWL2_1 first disposed in the cell block may be refreshed in the third active operation of the target refresh section.

The first word line control unit 460 may control the plurality of first word lines WL1_1 to WL1_N and the first redundancy word lines RWL1_1 to RWL1_M in response to the first block signal BLK1_SEL, the first redundancy signal RED_BLK1, the address signal ADD_SIG, and the redundancy word line signals RED_WL1 to RED_WL4. If the first block signal BLK1_SEL is activated, the first word line control unit 460 may activate a first word line corresponding to the address signal ADD_SIG when the first redundancy signal RED_BLK1 is deactivated, and may activate a redundancy word line corresponding to the redundancy word line signals RED_WL1 to RED_WL4 when the first redundancy signal RED_BLK1 is activated.

The second word line control unit 470 may control the plurality of second word lines WL2_1 to WL2_N and the second redundancy word lines RWL2_1 to RWL2_M in response to the second block signal BLK2_SEL, the second redundancy signal RED_BLK2 the address signal ADD_SIG, and the redundancy word line signals RED_WL5 to RED_WL8. If the second block signal BLK2_SEL is activated, the second word line control unit 470 may activate a second word line corresponding to the address signal ADD_SIG when the second redundancy signal RED_BLK2 is deactivated, and may activate a redundancy word line corresponding to the redundancy word line signals RED_WL5 to RED_WL8 when the second redundancy signal RED_BLK2 is activated.

Figure 5:
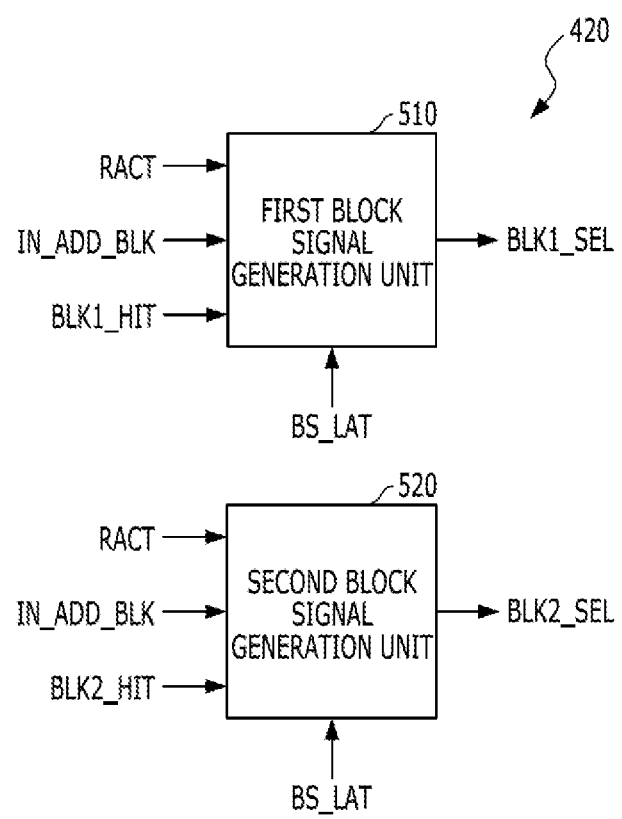
FIG. 5 is a detailed block diagram illustrating a cell block selection unit shown in FIG. 4.

FIG. 5 is a detailed block diagram illustrating the cell block selection unit 420 shown in FIG. 4.

As shown in FIG. 5, the cell block selection unit 420 may include a first block signal generation unit 510 and a second block signal generation unit 520.

When the active signal RACT is deactivated, the first block signal generation unit 510 may deactivate the first block signal BLK1_SEL. When the active signal RACT is activated, the first block to signal generation unit 510 may activate the first block signal BLK1_SEL in response to the input address IN_ADD_BLK corresponding to the first cell block 360 or an activation of the first block hit signal BLK1_HIT. When the block selection latch signal BS_LAT is activated, the first block signal generation unit 510 may maintain a state of the first block signal BLK1_SEL at a point of time at which the block selection latch signal BS_LAT is activated, during a section in which the block selection latch signal BS_LAT is activated.

When the active signal RACT is deactivated, the second block signal generation unit 520 may deactivate the second block signal BLK2_SEL. When the active signal RACT is activated, the second block signal generation unit 520 may activate the second block signal BLK2_SEL in response to the input address IN_ADD_BLK corresponding to the second cell block 370 or an activation of the second block hit signal BLK2_HIT. When the block selection latch signal BS_LAT is activated, the second block signal generation unit 520 may maintain a state of the second block signal BLK1_SEL at a point in time at which the block selection latch signal BS_LAT is activated, during a section in which the block selection latch signal BS_LAT is activated.

Figure 6:
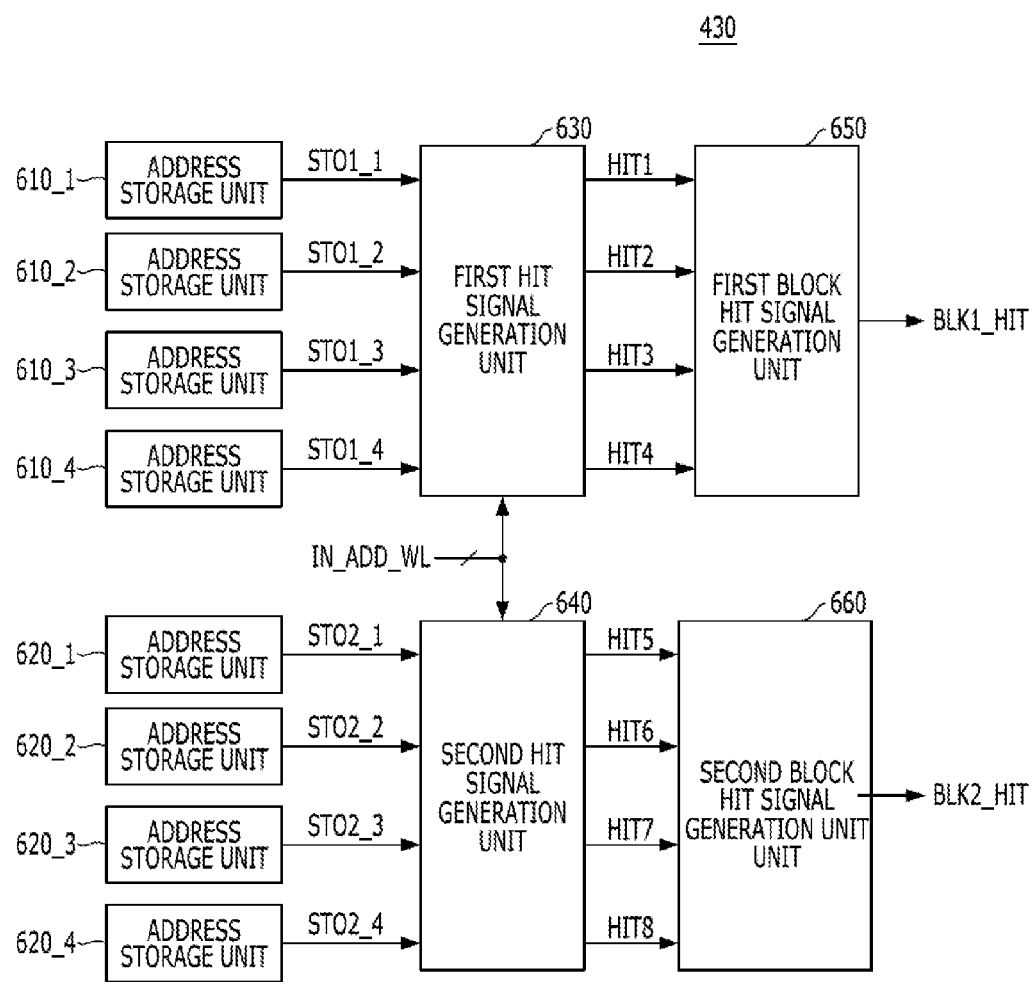
FIG. 6 is a detailed block diagram illustrating a hit signal generation unit shown in FIG. 4.

FIG. 6 is a detailed block diagram illustrating the hit signal generation unit 430 shown in FIG. 4.

As shown in FIG. 6, the hit signal generation unit 430 may include a plurality of address storage units 610_1 to 610_4 and 620_1 to 620_4, a first hit signal generation unit 630, a second hit signal generation unit 640, a first block hit signal generation unit 650, and a second block hit signal generation unit 660.

The plurality of first address storage units 610_1 to 610_4 may store an address of a first word line and output stored values STO1_1 to STO1_4. The first hit signal generation unit 630 may generate the first to fourth hit signals HIT1 to HIT4 by comparing each of the values STO1_1 to STO1_4 stored in the plurality of first address storage units 610_1 to 610_4, with the input address IN_ADD_WL. The first hit signal generation unit 630 may activate the first hit signal HIT1 if the input address IN_ADD_WL is identical to the value STO1_1 activate the second hit signal HIT2 if the input address IN_ADD_WL is identical to the value STO1_2, activate the third hit signal HIT3 if the input address IN_ADD_WL is identical to the value STO1_3 and activate the fourth hit signal HIT4 if the input address IN_ADD_WL is identical to the value STO1_4. When any of the first to fourth hit signals HIT1 to HIT4 is activated, the first block hit signal generation unit 650 may activate the first block hit signal BLK1_HIT.

The plurality of second address storage units 620_1 to 620_4 may store an address of a second word line and output stored values STO2_1 to STO2_4. The second hit signal generation unit 640 may generate the fifth to eighth hit signals HIT5 to HIT8 by comparing each of the values STO2_1 to STO2_4 stored in the plurality of second address storage units 620_1 to 620_4, with the input address IN_ADD_WL. The second hit signal generation unit 640 may activate the fifth hit signal HIT5 if the input address IN_ADD_WL is identical to the value STO2_1, activate the sixth hit signal HIT6 if the input address IN_ADD_WL is identical to the value STO2_4, activate the seventh hit signal HIT7 if the input address IN_ADD_WL is identical to the value STO2_3, and activate the eighth hit signal HIT8 if the input address IN_ADD_WL is identical to the value STO2_4. When any of the fifth to eighth hit signals HIT5 to HIT8 is activated, the second block hit signal generation unit 660 may activate the second block hit signal BLK2_HIT.

Figure 7:
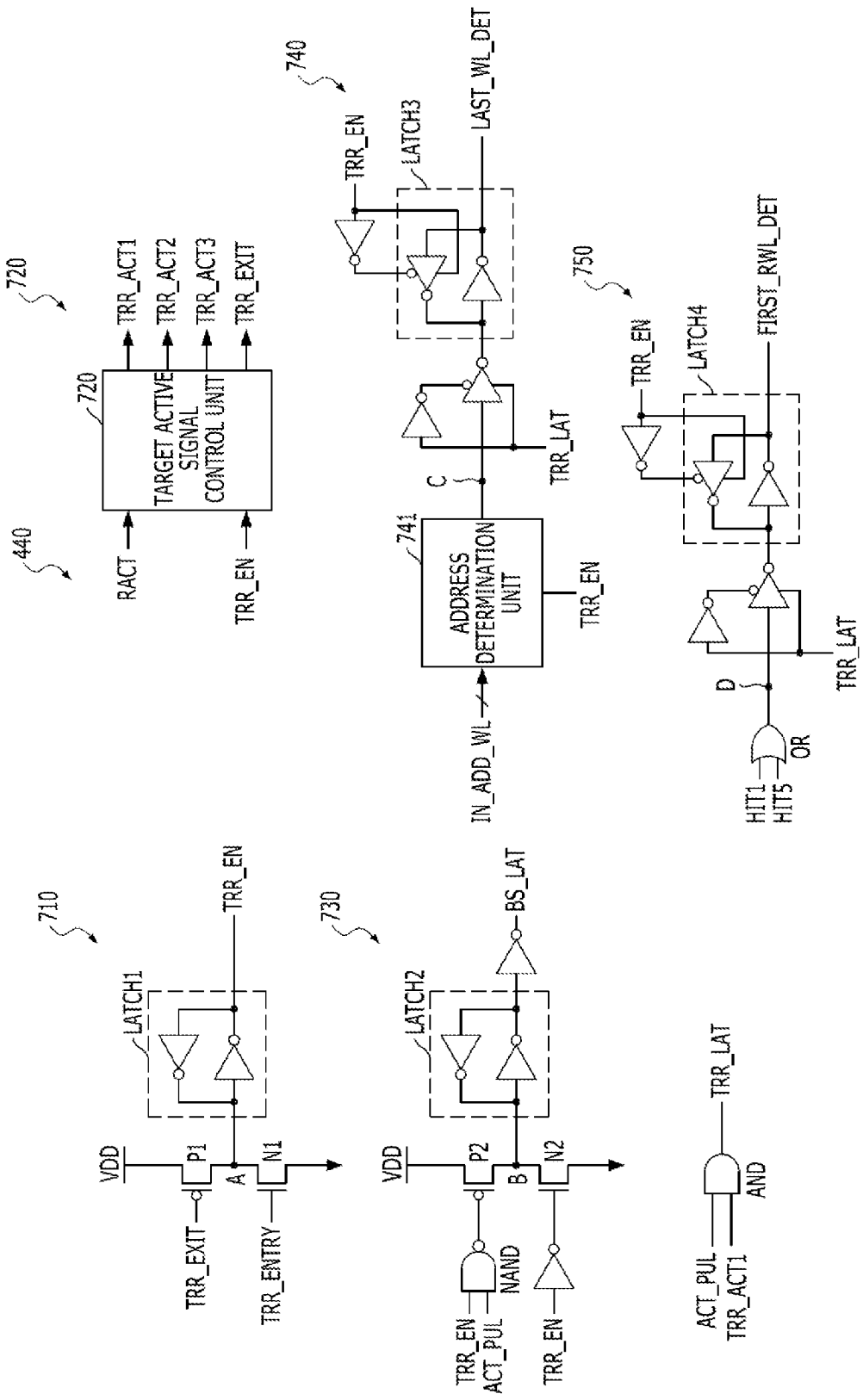
FIG. 7 is a detailed block diagram illustrating a target refresh control unit show in FIG. 4.

FIG. 7 is a detailed block diagram illustrating the target refresh control unit 440 shown in FIG. 4.

As shown in FIG. 7, the target refresh control unit 440 may include a section signal generation unit 710, a target active signal control unit 720, a latch signal generation unit 730, a first detection unit 740, and a second detection unit 750.

The section signal generation unit 710 may include transistors P1 and N1 and a latch LATCH1. When the entry signal TRR_ENTRY is activated, the transistor N1 may be turned on, a node A may be pulled down, and the section signal TRR_EN may be activated to a logic high level by the latch LATCH1. When a termination signal TRR_EXIT is activated, the transistor P1 may be turned on, the node A may be pulled up to a power supply voltage VDD, and the section signal TRR_EN may be deactivated to a logic low level by the latch LATCH1.

When the section signal TRR_EN is activated, the target active signal control unit 720 may generate the first to third target active signals TRR_ACT1 to TRR_ACT3 and the termination signal TRR_EXIT in response to the active signal RACT. The target active signal control unit 720 may activate the first target active signal TRR_ACT1 when the active signal RACT is first activated after the section signal TRR_EN is activated, activate the second target active signal TRR_ACT2 when the active signal RACT is second activated after the section signal TRR_EN is activated, and activate the third target active signal TRR_ACT3 when the active signal RACT is third activated after the section signal TRR_EN is activated. The activated target active signals TRR_ACT1 to TRR_ACT3 may be deactivated when the active signal RACT is deactivated. When the third target active signal TRR_ACT3 is deactivated, the target active signal control unit 720 may activate the termination signal TRR_EXIT. When the section signal TRR_EN is deactivated, the target active signal control unit 720 may deactivate all the first to third target active signals TRR_ACT1 to TRR_ACT3 and the termination signal TRR_EXIT.

The latch signal generation unit 730 may include transistors P2 and N2, a latch LATCH2, and gates NAND and AND. When the section signal TRR_EN is deactivated, the transistor N2 may be turned on, a node B may be pulled down, and the block selection latch signal BS_LAT may be deactivated. When the active pulse signal ACT_PUL is activated in the state in which the section signal TRR_EN has been activated, the transistor P2 may be turned on, the node B may be pulled up to the power supply voltage VDD, and the block selection latch signal BS_LAT may be activated. During the section in which the section signal TRR_EN is activated, the transistor N2 may be turned off thus, the block selection latch signal BS_LAT may maintain an activation state. When the active pulse signal ACT_PUL activated in the state in which the first target active signal TRR_ACT1 has been activated, the latch signal generation unit 730 may activate the latch signal TRR_LAT. For reference, the active pulse signal ACT_PUL may be a signal activated after a lapse of a specific time since the active command ACT is activated.

The first detection unit 740 may include an address determination unit 741 and a latch LATCH3. If the one or more bits IN_ADD_WL of input address IN_ADD corresponds to the word line WL1_N or WL2_N last disposed in a cell block when the section signal TRR_EN is activated, the address determination unit 741 may activate an output signal at a node C. The output signal at the node C is transferred to the latch LATCH3 when the latch signal TRR_LAT is activated. The latch LATCH3 may latch a signal received during the section in which the section signal TRR_EN is activated and may activate the first detection signal LAST_WL_DET.

The second detection unit 750 may include a gate OR and a latch LATCH4. The gate OR may activate a signal at a node D when the first hit signal HIT1 or the fifth hit signal HIT5 corresponding to a redundancy word line first disposed in a cell block is activated. The signal at the node D is transferred to the latch LATCH4 when the latch signal TRR_LAT is activated. The latch LATCH4 may latch a signal received during the section in which the section signal TRR_EN is activated and may activate the second detection signal FIRST_RWL_DET.

Figure 8:
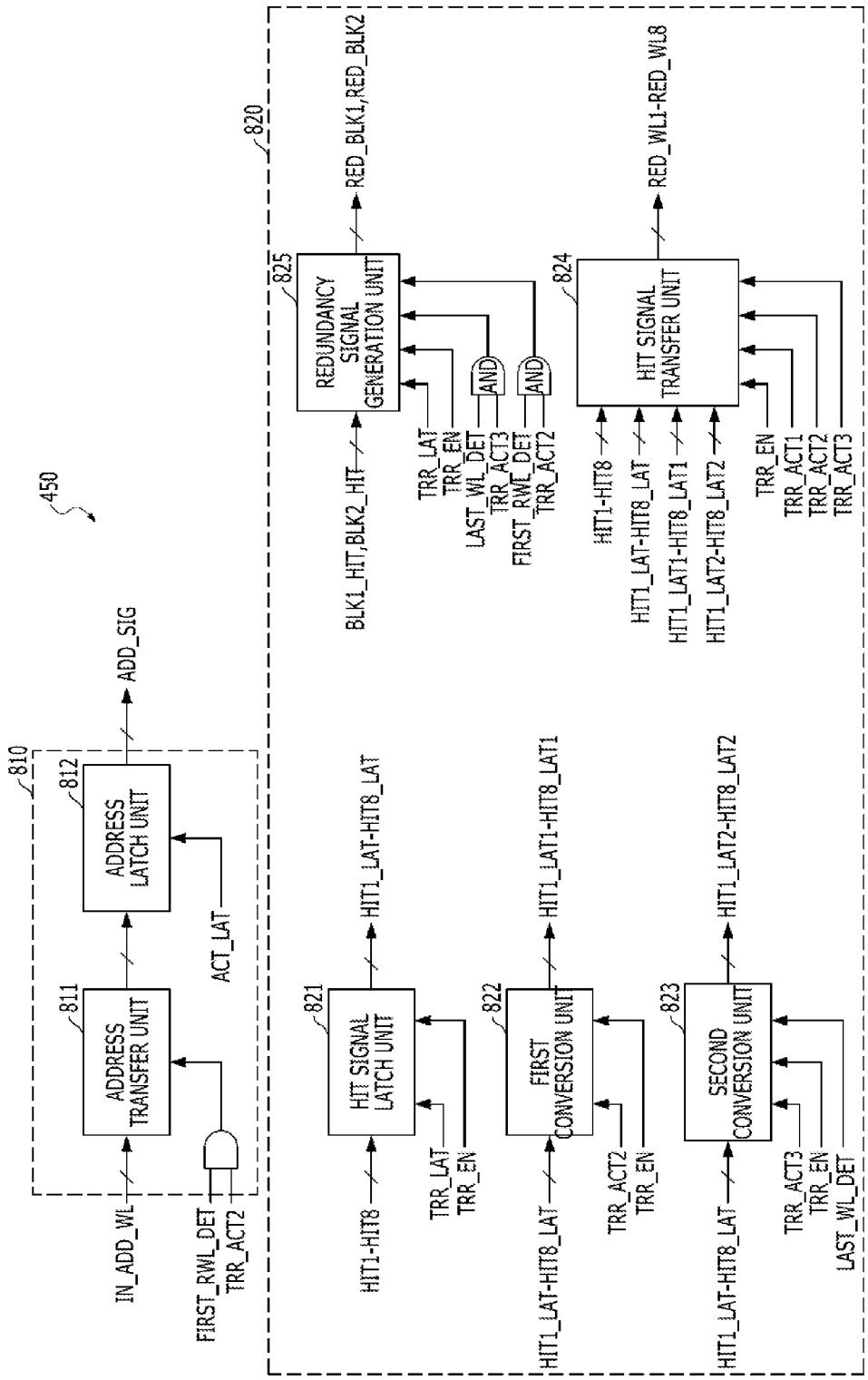
FIG. 8 is a detailed block diagram illustrating a word line control signal generation unit shown in FIG. 4.

FIG. 8 is a detailed block diagram illustrating the word line control signal generation unit 450 shown in FIG. 4.

As shown in FIG. 8, the word line control signal generation unit 450 may include an address signal generation unit 810 and a redundancy word line signal generation unit 820.

The address signal generation unit 810 may include an address transfer unit 811 and an address latch unit 812. The address transfer unit 811 transfers the input address IN_ADD_WL to the address latch unit 812, but may output a value corresponding to the word line WL1_N or WL2_N last disposed in a cell block irrespective of the input address IN_ADD_WL when the second detection signal FIRST_RWL_DET and the second target active signal TRR_ACT2 are activated.

When an active latch signal ACT_LAT is activated, the address latch unit 812 may latch an output signal of the address transfer unit 811 and output the latched signal as the address signal ADD_SIG. For reference, the active latch signal ACT_LAT may be a pulse signal that is activated after a lapse of a specific time since the active command ACT is activated.

The redundancy word line signal generation unit 820 may include a hit signal latch unit 821, a first conversion unit 822, a second conversion unit 823, a hit signal transfer unit 824, and a redundancy signal generation unit 825. When the latch signal TRR_LAT is activated, the hit signal latch unit 821 may receive the hit signals HIT1 to HIT8, latch the hit signals HIT1 to HIT8 during a section in which the section signal TRR_EN is activated, and output first to eighth latch hit signals HIT1_LAT to HIT8_LAT.

The first conversion unit 822 may generate latch hit signals HIT1_LAT1 to HIT8_LAT1. When the second target active signal TRR_ACT2 is activated and the section signal TRR_EN is activated, the first conversion unit 822 may transfer the latch hit signals HIT2_LAT to HIT4_LAT as the latch hit signals HIT1_LAT1 to HIT3_LAT1, respectively, transfer the latch hit signals HIT6_LAT to HIT8_LAT as the latch hit signals HIT5_LAT1 to HIT7_LAT1, respectively, and deactivate the latch hit signals HIT4_LAT1 and HIT5_LAT1.

The second conversion unit 823 may generate latch hit signals HIT1_LAT2 to HIT8_LAT2. When the third target active signal TRR_ACT3 is activated and the section signal TRR_EN is activated, the second conversion unit 823 may transfer the latch hit signals HIT1_LAT to HIT3_LAT as the latch hit signals HIT2_LAT2 to HIT4_LAT2, respectively, transfer the latch hit signals HIT5_LAT to HIT7_LAT as the latch hit signals HIT6_LAT2 to HIT8_LAT2, respectively, and deactivate the latch hit signals HIT1_LAT2 and HIT5_LAT2. Furthermore, if the second target active signal TRR_ACT2 is activated when the section signal TRR_EN and the first detection signal LAST_WL_DET are activated, the second conversion unit 823 may activate the latch hit signals HIT1_LAT2 and HIT5_LAT2.

When the section signal TRR_EN is deactivated, the hit signal transfer unit 824 may transfer the hit signals HIT1 to HIT8 as the word line redundancy signals RED_WL1 to RED_WL8 The hit signal transfer unit 824 may transfer the latch hit signals HIT1_LAT to HIT8_LIST as the word line redundancy signals RED_WL1 to RED_WL8 when the first target active signal TRR_ACT1 is activated, transfer the latch hit signals HIT1_LAT1 to HIT8_LAT1 as the word line redundancy signals RED_WL1 to RED_WL8 when the second target active signal TRR_ACT2 is activated, and transfer the latch hit signals HIT1_LAT2 to HIT8_LAT2 as the word line redundancy signals RED_WL1 to RED_WL8 when the third target active signal TRR_ACT3 is activated.

When the section signal TRR_EN is deactivated, the redundancy signal generation unit 825 may transfer the block hit signals BLK1_HIT and BLK2_HIT as the redundancy signals RED_BLK1 and RED_BLK2. When the latch signal TRR_LAT is activated and the section signal TRR_N is activated, the redundancy signal generation unit 825 may latch the block hit signals BLK1_HIT and BLK2_HIT and transfer the latched block hit signals BLK1_HIT and BLK2_HIT as the redundancy signals RED_BLK1 and RED_BLK2. When the second target active signal TRR_ACT2 is activated, the redundancy signal generation unit 825 may transfer the latched block hit signals BLK1_HIT and BLK2_HIT as the redundancy signals RED_BLK1 and RED_BLK2 when the second detection signal FIRST_RWL_DET is deactivated, and may deactivate the redundancy signals RED_BLK1 and RED_BLK2 when the second detection signal FIRST_RWL_DET is activated. When the third target active signal TRR_ACT3 is activated, the redundancy signal generation unit 825 may transfer the latched block hit signals BLK1_HIT and BLK2_HIT as the redundancy signals RED_BLK1 and RED_BLK2 when the first detection signal LAST_WL_DET is deactivated, and may activate the redundancy signals RED_BLK1 and RED_BLK2 when the first detection signal LAST_WL_DET is activated.

The operation of the control unit 350 is described below with reference back to the contents of FIGS. 4 to 8.

Common Active Operation

In a common active operation, all the control signals TRR_EN, BS_LAT, TRR_LAT, TRR_ACT1 to TRR_ACT3, LAST_WL_DET, and FIRST_RWL_DET for controlling a target refresh operation may be deactivated.

When a normal word line for example, WL1_1, is activated, the hit signal generation unit 430 may deactivate all the hit signals BLK1_HIT and BLK2_HIT and HIT1 to HIT8. The cell block selection unit 420 may activate the first block signal BLK1_SEL of the first cell block 360 that corresponds to the input address IN_ADD_BLK, and the word line control signal generation unit 450 may transfer the input address IN_ADD_WL as the address signal ADD_SIG and deactivate the first redundancy signal RED_BLK1. Additionally, the first word line control unit 460 may activate the word line WL1_1 selected from the first cell block 360 in response to the address signal ADD_SIG.

When a redundancy word line for example, RWL1_1 is activated the hit signal generation unit 430 may activate the first hit signal HIT1 and the first block hit signal BLK1_HIT because a value STO1_1 stored in the address storage unit is identical to the input address IN_ADD_WL, the cell block selection unit 420 may activate the first block signal BLK1_SEL of the first cell block 360 in response to the activated first block hit signal BLK1_HIT and the word line control signal generation unit 450 may transfer the first block hit signal BLK1_HIT and the hit signals HIT1 to HIT8 as the redundancy signal RED_BLK1 and the redundancy word line signals RED_WL1 RED_WL8, respectively, and activate the first redundancy signal RED_BLK1 and the redundancy word line signal RED_WL1. Additionally, the first word line control unit 460 may activate the first redundancy word line RWL1_1 selected the first cell block 360 in response to the first redundancy word line signal RED_WL1.

Target Refresh Operation

The operation of the target refresh control unit 440 upon a target refresh operation may be the same as that described with reference to FIG. 4.

When a word line selected based on the first input address ADD1 is a word line for example, WL1_3, not being adjacent to a redundancy word line, the hit signal generation unit 430 may deactivate all the hit signals BLK1_HIT and BLK2_HIT and HIT1 to HIT8 in the first active operation, the cell block selection unit 420 may activate the first block signal BLK1_SEL of the first cell block 360 corresponding to the input address IN_ADD_BLK and maintain the activation state during a section in which the block selection latch signal BS_LAT is activated and the word line control signal generation unit 450 may latch the block hit signals BLK1_HIT and BLK2_HIT that have not been activated in the first active operation. Additionally, the word line control signal generation unit 450 may transfer the block hit signals BLK1_HIT and BLK2_HIT latched in the first to third active operations, as the redundancy signals RED_BLK1 and RED_BLK2. Accordingly in the first to third active operations, the redundancy signals RED_BLK1 and RED_BLK2 may be deactivated. The word line control signal generation unit 450 may transfer the input address IN_ADD_WL as the address signal ADD_SIG in the first to third active operations.

In the first to third active operations, the first word line control unit 460 may activate a word line selected from to the first cell block 360 in response to the address signal ADD_SIG. Accordingly, the word lines WL1_3, WL1_2, and WL1_4 may be sequentially activated.

When a word line selected based on the first input address ADD1 is a word line last disposed in a cell block from among normal word lines for example, WL1_N, the target refresh control unit 440 activates the first detection signal LAST_WL_DET.

In the first active operation, the hit signal generation unit 430 may deactivate all the hit signals BLK1_HIT, BLK2_HIT and HIT1 to HIT8. The cell block selection unit 420 may activate the first block signal BLK1_SEL of the first cell block 360 that corresponds to the input address IN_ADD_BLK and maintain the activation state during a section in which the block selection latch signal BS_LAT is activated.

The word line control signal generation unit 450 may latch the block hit signals BLK1_HIT and BLK2_HIT that have not been activated in the first active operation. The word line control signal generation unit 450 may transfer the latched block hit signals BLK1_HIT and BLK2_HIT as the redundancy signals RED_BLK1 and RED_BLK2 in the first and the second active operations, and may activate the redundancy signals RED_BLK1 and RED_BLK2 in the third active operation. The word line control signal generation unit 450 may transfer the input address IN_ADD_WL as the address signal ADD_SIG in the first and the second active operations, and may activate the redundancy word line signal RED_WL1 in the third active operation.

The first word line control unit 460 may activate a word line selected from the first cell block 360 in response to the address signal ADD_SIG in the first and the second active operations, and may activate the word line selected from the first cell block 360 in response to the redundancy word line signal RED_WL1 activated in the third active operation. Accordingly, the word lines WL1_N, WL1_N−1, and RWL1_1 may be sequentially activated.

When a word line selected based on the first input address ADD1 is a redundancy word line first disposed in a cell block for example, RWL1_1 the target refresh control unit 440 activates the second detection signal FIRST_RWL_DET.

In the first active operation, the hit signal generation unit 430 may activate the first hit signal HIT1 and the first block hit signal BLK1_HIT. The cell block selection unit 420 may activate the first block signal BLK1_SEL of the first cell block 360 in response to the activated first block hit signal BLK1_HIT and may maintain the activation state during a section in which the block selection latch signal BS_LAT is activated.

The word line control signal generation unit 450 may latch the first block hit signal BLK1_HIT activated in the first active operation. The word line control signal generation unit 450 may transfer the latched first block hit signal BLK1_HIT as the redundancy signal RED_BLK1 in the first and the third active operations, and may deactivate the redundancy signal RED_BLK1 in the second active operation. The word line control signal generation unit 450 may transfer the first hit signal HIT1 as the redundancy word line signal RED_WL1 in the first active operation, output a value corresponding to the word line WL1_N last disposed in the cell block as the address signal ADD_SIG in the second active operation, and transfer the first hit signal HIT1 as the redundancy word line signal RED_L2 in the third active operation.

The first word line control unit 460 may activate a word line selected from the first cell block 360 in response to the redundancy word line signals RED_WL1 and RED_WL2 activated in the first, and the third active operations, and may activate a word line selected from the first cell block 360 in response to the address signal ADD_SIG in the second active operation. Accordingly, the word lines RWL1_1, WL1_N, and RWL1_2 may be sequentially activated.

When a word line selected based on the first input address ADD1 is a redundancy word line for example, RWL1_2, during the first active operation, the hit signal generation unit 430 may activate the second hit signal HIT2 and the first block hit signal BLK1_HIT. The cell block selection unit 420 may activate the first block signal BLK1_SEL of the first cell block 360 in response to the activated first block hit signal BLK1_HIT and maintain the activation state during a section in which the block selection latch signal BS_LAT is activated.

The word line control signal generation unit 450 may latch the first block hit signal BLK1_HIT activated in the first active operation. In the first to third active operations, the word line control signal generation unit 450 may transfer the latched first block hit signal BLK1_HIT as the redundancy signal RED_BLK1. The word line control signal generation unit 450 may transfer the second hit signal HIT2 as the redundancy word line signal RED_WL2 in the first active operation, transfer the second hit signal HIT2 as the redundancy word line signal RED_WL1 in the second active operation, and transfer the second hit signal HIT2 as the redundancy word line signal RED_WL3 in the third active operation.

The first word line control unit 460 may activate a word line selected from the first cell block 360 in response to the redundancy word line signals RED_WL2, RED_WL1, and RED_WL3 activated in the first to third active operations. Accordingly, the word lines RWL1_2, RWL1_1, and RWL1_3 may be sequentially activated.

FIGS. 9A to 9D are diagrams illustrating the target refresh operation of the memory shown in FIGS. 3 to 8.

The memory may include a plurality of word lines WL1 to WLN and one or more redundancy word lines RWL1 to RWLM for substituting one or more of the word lines.

Figure 9A:
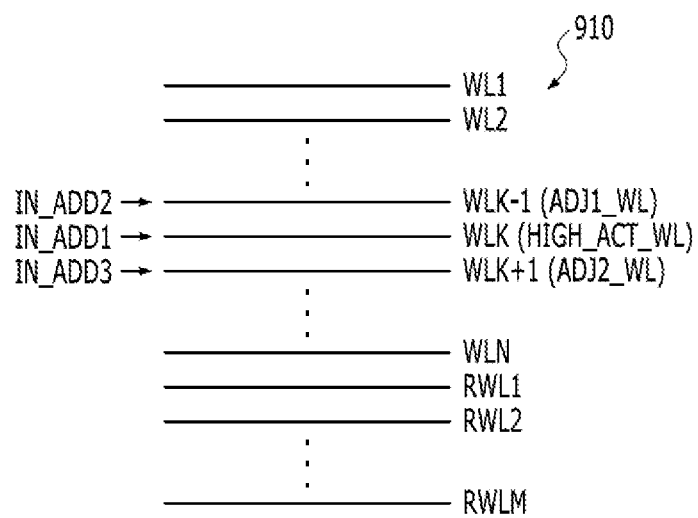
FIG. 9A is a diagram illustrating a target refresh operation of the memory shown in FIGS. 3 to 8.

Referring to FIG. 9A, when a frequently activated word line HIGH_ACT_WL is one of the plurality of word lines WL1 to WLN−1, i.e., WLK, the memory may sequentially activate and precharge a first adjacent word lines WLK−1 (ADJ1_WL) in response to an input address IN_ADD2 and a second adjacent word line WLK+1 (ADJ2_WL) in response to an input address IN_ADD3.

Figure 9B:
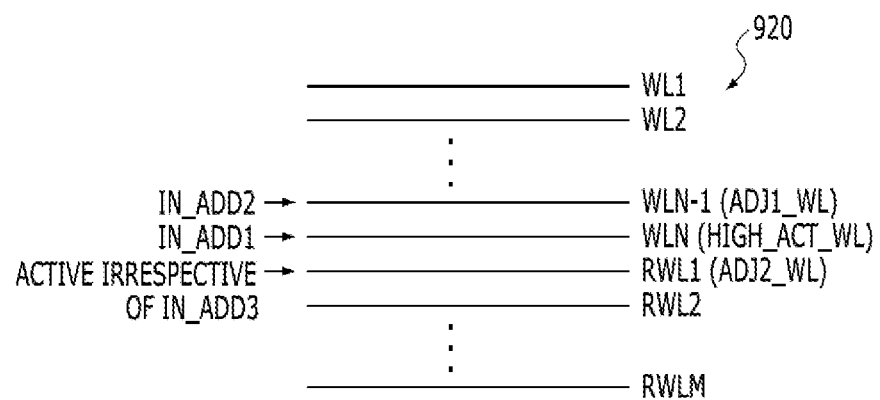
FIG. 9B is a diagram illustrating a target refresh operation of the memory shown in FIGS. 3 to 8.

Referring to FIG. 9B, when a frequently activated word line HIGH_ACT_WL is the word line WLN last disposed in a cell block, the memory may activate and precharge a first adjacent word line WLN−1 (ADJ1_WL) ire response to the input address IN_ADD2, and may activate and precharge a second adjacent word line RWL1 (ADJ2_WL) irrespective of an input address IN_ADD3.

Figure 9C:
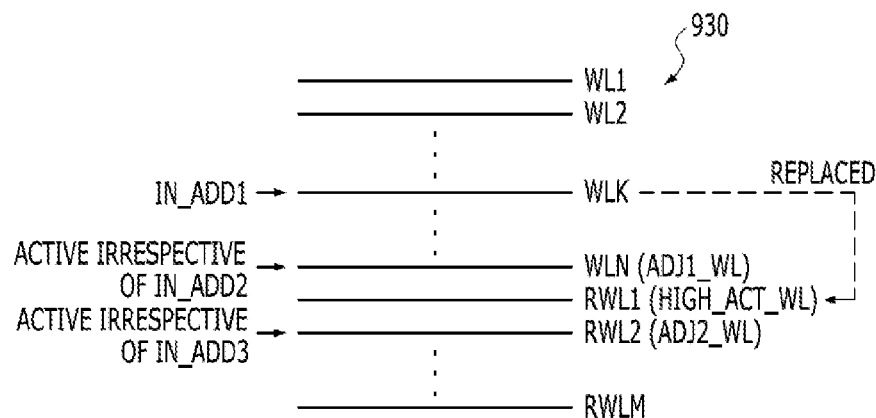
FIG. 9C is a diagram illustrating a target refresh operation of the memory shown in FIGS. 3 to 8.

Referring to FIG. 9C, when a frequently activated word line HIGH_ACT_WL is the redundancy word line RWL1 first disposed in a cell block, the memory may activate and precharge a first adjacent word line WLN (ADJ1_WL) irrespective of an input address IN_ADD2, and may activate and precharge a second adjacent word line RWL2 (ADJ2_WL) irrespective of an input address IN_ADD3.

Figure 9D:
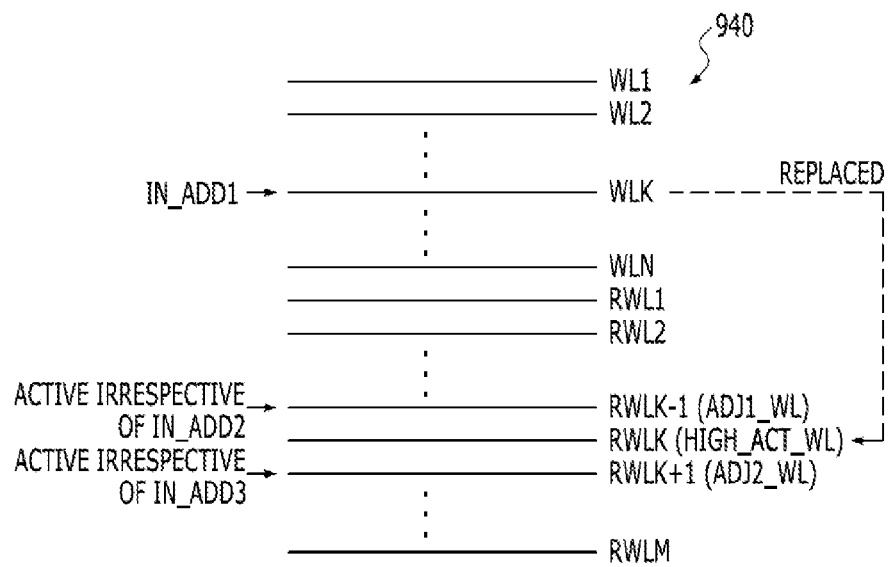
FIG. 9D is a diagram illustrating a target refresh operation of the memory shown in FIGS. 3 to 8.

Referring to FIG. 9D, when a frequently activated word line HIGH_ACT_WL is a redundancy word line RWLK, the memory may activate and precharge a first adjacent word line RWLK−1 (ADJ1_WL) irrespective of an input address IN_ADD2 and may activate and precharge a second adjacent word line RWLK+1 (ADJ2_WL) irrespective of the input address IN_ADD3.

Figure 10:
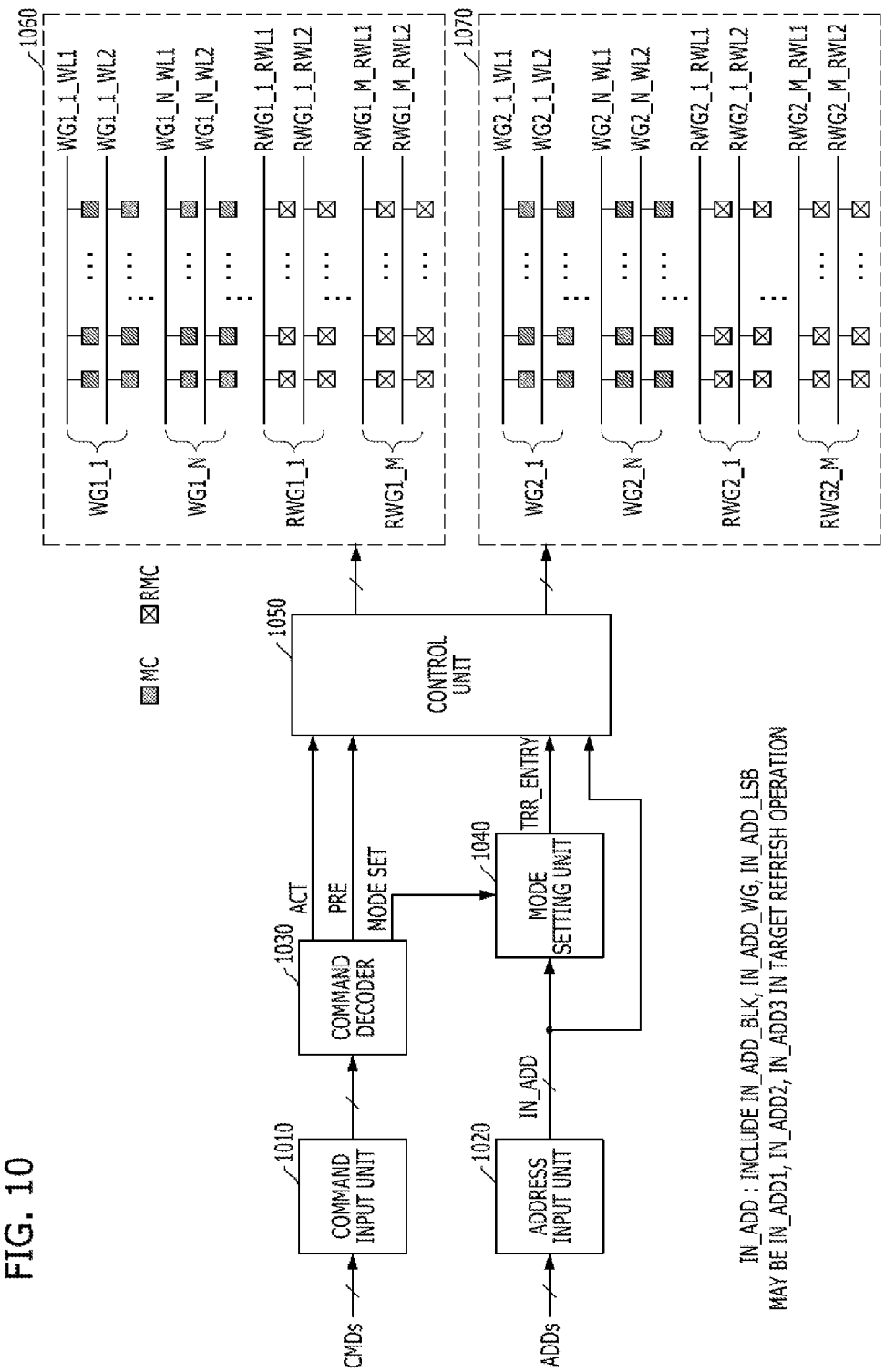
FIG. 10 is a block diagram illustrating a memory in accordance with another exemplary embodiment according to the present invention.

FIG. 10 is a block diagram illustrating a memory in accordance with another exemplary embodiment according to the present invention.

As shown in FIG. 10, the memory may include a command input unit 1010, an address input unit 1020, a command decoder 1030, a mode setting unit 1040, a control unit 1050, a first cell block 1060, and a second cell block 1070. FIG. 10 illustrates elements related to an active operation and a target refresh operation in the memory, except for elements related to the other operations such as a read operation, a write operation, and the like.

The memory is described with reference to FIG. 10.

The memory of FIG. 10 has a similar construction and operation to the memory of FIG. 3 except that a word line group including two or more word lines is replaced with a redundancy word line group including two or more redundancy word line groups.

A description of the command input unit 1010, the address input unit 1020, the command decoder 1030 and the mode setting unit 1040 is substantially the same as that of the command input unit 310, the address input unit 320, the command decoder 330, and the mode setting unit 340 of FIG. 3.

The first cell block 1060 may include a plurality of first word line groups WG1_1 to WG1_N including two or more first word lines WG1_1_WL1 to WG1_N_WL2, and one or more first redundancy word line groups RWG1_1 to RWG1_M including two or more first redundancy word lines RWG1_1_WL1 to RWG1_M_WL2 and replacing at least one of the plurality of first word line groups WG1_1 to WG1_N. As shown in FIG. 10, the plurality of first word line groups WG1_1 to WG1_N ray be sequentially disposed in the first cell block 1060, and the first redundancy word line groups RWG1_1 to RWG1_M may be sequentially disposed behind the first word line groups WG1_1 to WG1_N that are last disposed in the first cell block 1060.

The second cell block 1070 may include a plurality of second word line groups WG2_1 to WG2_N including two or more second word lines WG2_1_WL1 to WG2_N_WL2, and one or more second redundancy word line groups RWG2_1 to RWG2_M including two or more second redundancy word lines RWG2_1_WL1 to RWG2_M_WL2 and replacing at least one of the plurality of second word line groups WG2_1 to WG2_N. As shown in FIG. 10, the plurality of second word line groups WG2_1 to WG2_N may be sequentially disposed in the second cell block 1070, and the second redundancy word line groups RWG2_1 to RWG2_M may be sequentially disposed behind the second word line groups WG2_1 to WG2_N last disposed in the second cell block 1070.

Each of the first and second cell blocks 1060 and 1070 includes a plurality of bit lines, and memory cells MC are coupled with the bit lines and word lines. The memory in accordance with the exemplary embodiment is related to access to a word line, and thus the bit lines are not shown. An example in which each cell block includes four redundancy word line groups (M=4) is described below.

Figure 11:
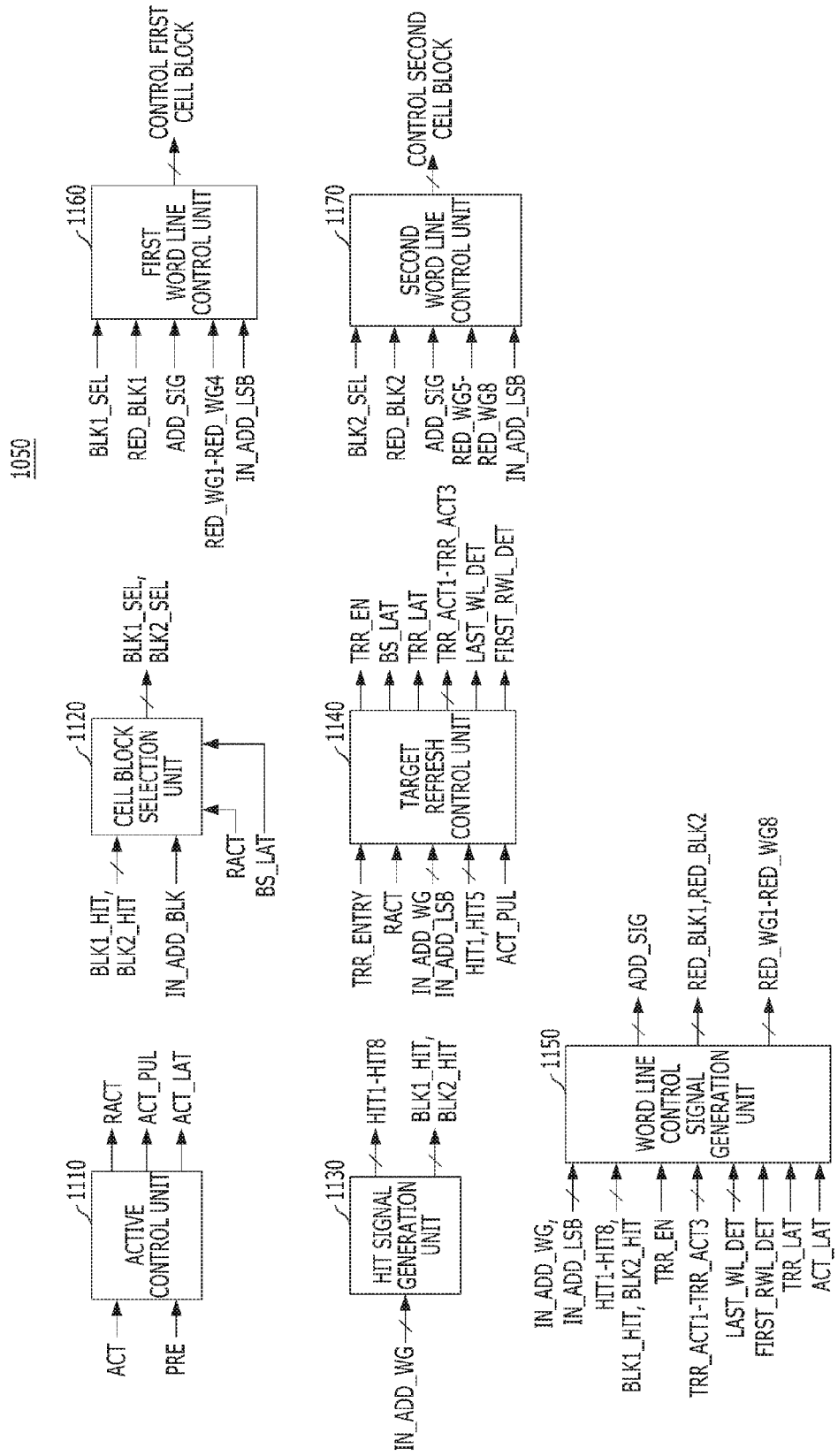
FIG. 11 is a detailed block diagram illustrating a control unit shown in FIG. 10.

FIG. 11 is a detailed block diagram illustrating the control unit 1050 shown in FIG. 10.

As shown in FIG. 11, the control unit 1050 may include an active control unit 1110, a cell block selection unit 1120, a hit signal generation unit 1130, a target refresh control unit 1140, a word line control signal generation unit 1150, a first word line control unit 1160, and a second word line control unit 1170. Hereinafter, input addresses IN_ADD may include one or more bits IN_ADD_BLK for selecting a cell block, one or more bits IN_ADD_WG for selecting a word line group, and the least significant bit (LSB) IN_ADD_LSB for selecting a word line from a selected word line group.

The operation of the control unit 1050 is described with reference to FIGS. 4 and 11.

A description of the active control unit 1110, the cell block selection unit 1120, and the hit signal generation unit 1130 is similar to that of the active control unit 410, the cell block selection unit 420, and the hit signal generation unit 430 of FIG. 4. However, a fail address stored in the hit signal generation unit 430 may correspond to a word line group, the first to fourth hit signals HIT1 to HIT4 may correspond to the first redundancy word line groups RWL1_1 to RWL1_M, and the fifth to eighth hit signals HIT5 to HIT8 may correspond to the second redundancy word line groups RWL2_1 to RWL2_M.

Differing from target refresh control unit 340 of FIG. 3, the target refresh control unit 1140 may generate a first detection signal LAST_WL_DET by detecting a word line WG1_N_WL2 or WG2_N_WL2 last disposed in a cell block based on input addresses IN_ADD_WG and IN_ADD_LSB (corresponding to the input address IN_ADD_WL of FIG. 3), and may generate a second detection signal FIRST_RWL_DET by detecting the redundancy word line RWG1_1_RWL1 or RWG2_1_RWL1 first disposed in a cell block in response to the fifth to eighth hit signal HIT1 or HIT5 and the LSB IN_ADD_LSB. The remaining operations of the target refresh control unit 1140 may be the same as those of the target refresh control unit 340 of FIG. 3. For reference, if the fifth to eighth hit signal HIT1 or HIT5 is activated and the LSB IN_ADD_LSB corresponds to a word line first disposed in a cell block, from among word lines of a word line group, the redundancy word line RWG1_1_RWL1 or RWG2_1_RWL1 first disposed in the cell block may be selected.

The word line control signal generation unit 1150 may generate first and second redundancy signals RED_BLK1 and RED_BLK2, an address signal ADD_SIG, and first to eighth redundancy word line group signals RED_WG1 to RED_WG8 for controlling the plurality of word lines WG1_1_WL1 to WG1_N_WL2, and WG2_1_WL1 to WG2_N_WL2, and the redundancy word lines RWG1_1_RWL1 to RWG1_M_RWL2 and RWG2_1_RWL1 to RWG2_M_RWL2 of the cell blocks based on input addresses IN_ADD including the input addresses IN_ADD_WG and IN_ADD_LSB, first and second block hit signals BLK1_HIT and BLK2_HIT, first to eighth hit signals HIT1 to HIT8, a section signal TRR_EN, first to third target active signals TRR_ACT1 to TRR_ACT3, a latch signal TRR_LAT, an active latch signal ACT_LAT, the first detection signal LAST_WL_DET, and the second detection signal FIRST_RWL_DET.

The word line control signal generation unit 1150 transfers the input addresses IN_ADD_WG and IN_ADD_LSB as the address signal ADD_SIG. When a word line selected based on the first input address IN_ADD1 is the redundancy word line RWG1_1_RWL1 or RWG2_1_RWL1 first disposed in a cell block in a target refresh operation, the word line control signal generation unit 1150 may output a value corresponding to the word line WG1_N_WL2 or WG2_N_WL2 last disposed in the cell block, as the address signal ADD_SIG.

The word line control signal generation unit 1150 latches the input addresses IN_ADD_WG and IN_ADD_LSB and transfers the input addresses IN_ADD_WG and IN_ADD_LSB as the address signal ADD_SIG. However, when the second detection signal FIRST_RWL_DET is activated, the word line control signal generation unit 1150 may output a value corresponding to the word line WG1_N_WL2 or WG2_N_WL2 last disposed in a cell block, as the address signal ADD_SIG irrespective of the input addresses IN_ADD_WG and IN_ADD_LSB during a section in which the second target active signal TRR_ACT2 is activated. In this case, the word line WG1_N_WL2 or WG2_N_WL2 last disposed in a selected cell block may be refreshed in the second active operation of the target refresh section.

The word line control signal generation unit 1150 may transfer the block hit signals BLK1_HIT and BLK2_HIT as the redundancy signals RED_BLK1 and RED_BLK2. In the first active operation of the target refresh section, the word line control signal generation unit 1150 may latch the block hit signals BLK1_HIT and BLK2_HIT and transfer the latched block hit signals as the redundancy signals RED_BLK1 and RED_BLK2. If a word line selected based on the first input address IN_ADD1 is the redundancy word line RWG1_1_RWL1 or RWG2_1_RWL1 first disposed in a cell block, the word line control signal generation unit 1150 may deactivate the redundancy signals RED_BLK1 and RED_BLK2 in the second active operation of the target refresh section. In other cases, the word line control signal generation unit 1150 may transfer the latched block hit signals BLk1_HIT and BLK2_HIT as the redundancy signals RED_BLK1 and RED_BLK2. If a word line selected based on the first input address IN_ADD1 is the word line WG1_N_WL2 or WG2_N_WL2 last disposed in a cell block, the word line control signal generation unit 1150 may activate the redundancy signals RED_BLK1 and RED_BLK2 and transfer the latched block hit signals BLK1_HIT and BLK2_HIT as the redundancy signals RED_BLK1 and RED_BLK2 in the third active operation of the target refresh section.

The word line control signal generation unit 1150 transfers the hit signals HIT1 to HIT8 as the respective redundancy word line group signals RED_WG1 to RED_WG8. Here, the word line control signal generation unit 1150 may latch the hit signals HIT1 to HIT8 in the first active operation of the target refresh section, and generate the redundancy word line group signals RED_WG1 to RED_WG8 in response to the latched hit signals HIT1 to HIT8 in the second and the third active sections of the target refresh section.

When the section signal TRR_EN is deactivated, the word line control signal generation unit 1150 may transfer the plurality of hit signals HIT1 to HIT8 so that the plurality of redundancy word lines group signals RED_WG1 to RED_WG8 are generated. When the section signal TRR_EN is activated, the word line control signal generation unit 1150 may receive the plurality of hit signals HIT1 to HIT8 in a state that the latch signal TRR_LAT is activated, and latch the received hit signals HIT1 to HIT8 until the section signal TRR_EN is deactivated.

When the first to third target active signals TRR_ACT1 to TRR_ACT3 are activated, the word line control signal generation unit 1150 may generate the plurality of redundancy word line signals RED_WG1 to RED_WG8 as in Table 2 to Table 4. For reference, when the LSB IN_ADD_LSB is 0, the LSB IN_ADD_LSB may correspond to a word line first disposed in a word line group. When the LSB IN_ADD_LSB is 1, the LSB IN_ADD_LSB may correspond to a word line last disposed in a word line group.

TABLE 2

| Activation section of TRR1_ACT | LSB is 0 | LSB is 1 |
| --- | --- | --- |
| RED_WG1 | Transfer HIT1 | Transfer HIT1 |
| RED_WG2 | Transfer HIT2 | Transfer HIT2 |
| RED_WG3 | Transfer HIT3 | Transfer HIT3 |
| RED_WG4 | Transfer HIT4 | Transfer HIT4 |
| RED_WG5 | Transfer HIT5 | Transfer HIT5 |
| RED_WG6 | Transfer HIT6 | Transfer HIT6 |
| RED_WG7 | Transfer HIT7 | Transfer HIT7 |
| RED_WG8 | Transfer HIT8 | Transfer HIT8 |

TABLE 3

| Activation section of TRR2_ACT | LSB is 0 | LSB is 1 |
| --- | --- | --- |
| RED_WG1 | Transfer HIT2 | Transfer HIT1 |
| RED_WG2 | Transfer HIT3 | Transfer HIT2 |
| RED_WG3 | Transfer HIT4 | Transfer HIT3 |
| RED_WG4 | Deactivate | Transfer HIT4 |
| RED_WG5 | Transfer HIT6 | Transfer HIT5 |
| RED_WG6 | Transfer HIT7 | Transfer HIT6 |
| RED_WG7 | Transfer HIT8 | Transfer HIT7 |
| RED_WG8 | Deactivate | Transfer HIT8 |

TABLE 4

| Activation section of TRR2_ACT | LSB is 0 | LSB is 1 |
| --- | --- | --- |
| RED_WG1 | Transfer HIT1 | Deactivate |
| RED_WG2 | Transfer HIT2 | Transfer HIT1 |
| RED_WG3 | Transfer HIT3 | Transfer HIT2 |
| RED_WG4 | Transfer HIT4 | Transfer H1T3 |
| RED_WG5 | Transfer HIT5 | Deactivate |
| RED_WG6 | Transfer HIT6 | Transfer HIT5 |
| RED_WG7 | Transfer HIT7 | Transfer HIT6 |
| RED_WG8 | Transfer HIT8 | Transfer HIT7 |

When the first target active signal TRR_ACT1 is activated, the word line control signal generation unit 1150 may transfer each hit signal HITK as the corresponding redundancy word line group signal RED_WGK. When the second target active signal TRR_ACT2 is activated, the word line control signal generation unit 1150 may transfer each hit signal HITK as a redundancy word line group signal RED_WGK−1 ahead of the corresponding redundancy word line group signal RED_WGK if the LSB IN_ADD_LSB is 0, and transfer each hit signal HITK as the corresponding redundancy word line group signal RED_WGK if the LSB IN_ADD_LSB is 1. When the third target active signal TRR_ACT3 is activated, the word line control signal generation unit 1150 may transfer each hit signal HITK as a redundancy word line group signal RED_WGK+1 behind the original and corresponding redundancy word line group signal RED_WGK if the LSB IN_ADD_LSB is 1, and transfer each hit signal HITK as the corresponding redundancy word line group signal RED_WGK if the LSB IN_ADD_LSB is 0. If there is no hit signal to be transferred, the word line control signal generation unit 1150 ray deactivate the redundancy word line group signals.

If a word line selected based on the first input address IN_ADD1 is the word line WG1_N_WL2 or WG2_N_WL2 last disposed in a cell block in the target refresh operation, i.e., the first detection signal LAST_WL_DET is activated, the word line control signal generation unit 1150 may activate the redundancy word line group signal RED_WG1 or RED_WG5 corresponding to a redundancy word line group first disposed in a cell block, irrespective of the hit signals HIT1 to HIT8.

That is, when the first detection signal LAST_WL_DET is activated, the word line control signal generation unit 1150 may activate the redundancy word line group signal RED_WG1 or RED_WG5, corresponding to a redundancy word line group first disposed in a cell block, irrespective of the hit signals HIT1 to HIT8 during a section in which the third target active signal TRR_ACT3 is activated. In this case, in the third active operation of the target refresh section, the redundancy word line RWL1_1_RWL1 or RWL2_1_RWL1 first disposed in a selected cell block may be refreshed.

The first word line control unit 1160 may control the plurality of first word lines WG1_1_WL1 to WG1_N_WL2 and the first redundancy word lines RWG1_1_RWL1 to RWG1_M_RWL2 in response to the first block signal BLK1_SEL, the first redundancy signal RED_BLK1, the address signal ADD_SIG, the redundancy word line group signals RED_WG1 to RED_WG4, and the LSB IN_ADD_LSB. If the first block signal BLK1_SEL is activated, the first word line control unit 1160 may activate a first word line corresponding to the address signal ADD_SIG when the first redundancy signal RED_BLK1 is deactivated, and may activate a first redundancy word line corresponding to the redundancy word line group signals RED_WG1 to RED_WG4 and the LSB IN_ADD_LSB when the first redundancy signal RED_BLK1 is activated.

The second word line control unit 1170 may control the plurality of second word lines WG2_1_WL1 to WG2_N_WL2 and the second redundancy word lines RWG2_1_RWL1 to RWG2_M_RWL2 in response to the second block signal BLK2_SEL, the second redundancy signal RED_BLK2, the address signal ADD_SIG, the redundancy word line group signals RED_WG5 to RED_WG8, and the LSB IN_ADD_LSB. If the second block signal BLK2_SEL is activated, the second word line control unit 1170 may activate a second word line corresponding to the address signal ADD_SIG when the second redundancy signal RED_BLK2 is deactivated, and may activate a second redundancy word line corresponding to the redundancy word line group signals RED_WG5 to RED_WG8 and the LSB IN_ADD_LSB when the second redundancy signal RED_BLK2 is activated.

Figure 12:
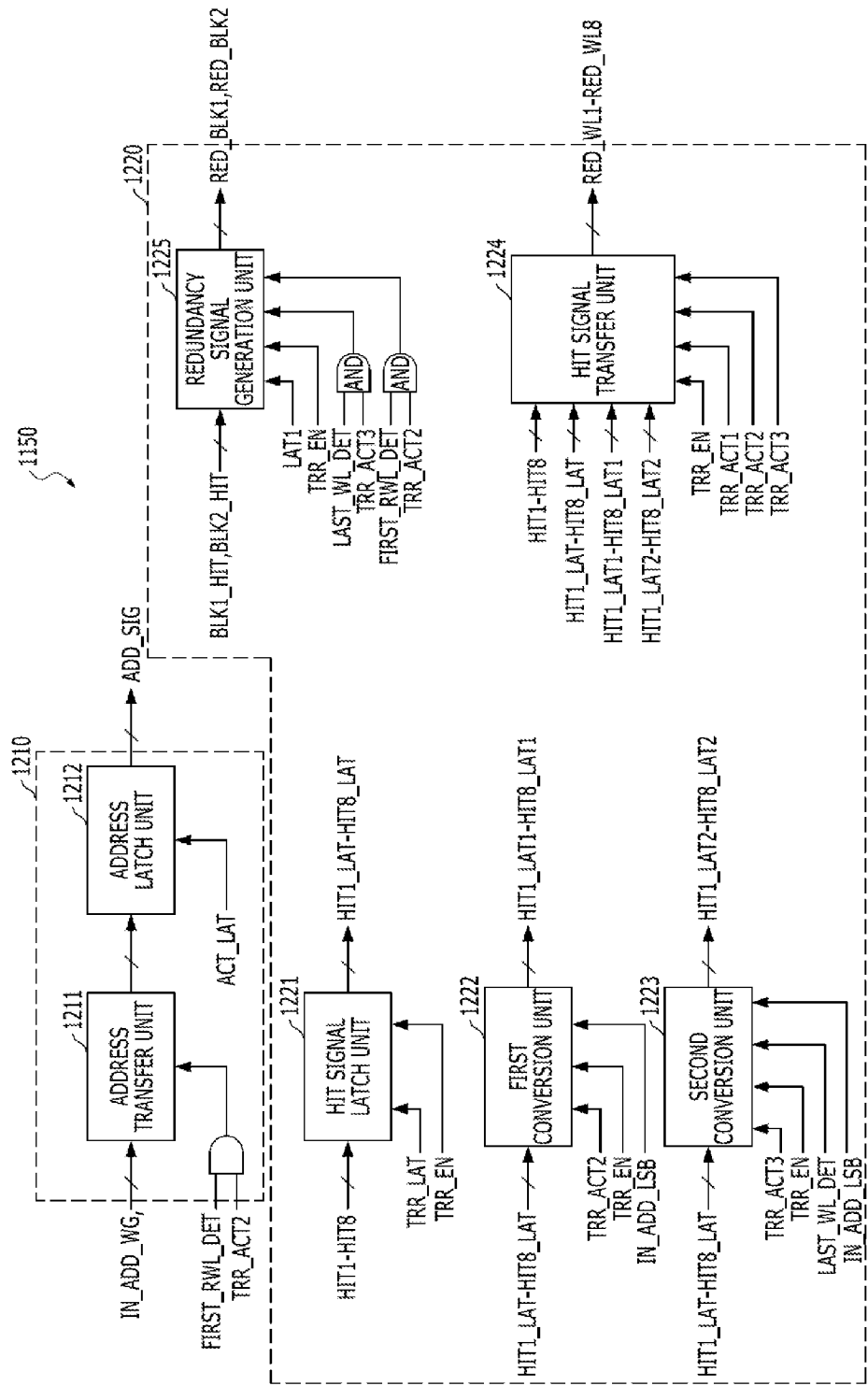
FIG. 12 is a detailed block diagram illustrating a word line control signal generation unit shown in FIG. 11.

FIG. 12 is a detailed block diagram illustrating the word line control signal generation unit 1150 shown FIG. 11.

As shown in FIG. 12, the word line control signal generation unit 1150 may include an address signal generation unit 1210 and a redundancy word line signal generation unit 1220.

The address signal generation unit 1210 may include an address transfer unit 1211 and an address latch unit 1212. The address transfer unit 1211 transfers the input address IN_ADD_WG to the address latch unit 1212. When the second detection signal FIRST_RWL_DET and the second target active signal TRR_ACT2 are activated, the address transfer unit 1211 may output a value corresponding to the word lines WG1_N_WL2 or WG2_N_WL2 last disposed in a cell block, irrespective of the input address IN_ADD_WG.

When an active latch signal ACT_LAT is activated, the address latch unit 1212 may latch an output signal of the address transfer unit 1211 and output the latched signal as the address signal ADD_SIG. For reference, the active latch signal ACT_LAT may be a signal that is activated after a lapse of a specific time since an active command ACT is activated.

The redundancy word line signal generation unit 1220 may include a hit signal latch unit 1221, a first conversion unit 1222, a second conversion unit 1223, a hit signal transfer unit 1224, and a redundancy signal generation unit 1225. When the latch signal TRR_LAT is activated, the hit signal latch unit 1221 may receive the hit signals HIT1 to HIT8, latch the received hit signals HIT1 to HIT8 during a section in which the section signal TRR_EN is activated, and output the latched hit signals as latch hit signals HIT1_LAT to HIT8_LAT.

The first conversion unit 1222 may generate latch hit signals HIT1_LAT1 to HIT8_LAT1. When the second target active signal TRR_ACT2 is activated and the section signal TRR_EN is activated, the first conversion unit 1222 may transfer the latch hit signals HIT2_LAT to HIT4_LAT as the respective latch hit signals HIT1_LAT1 to HIT3_LAT1, transfer the latch hit signals HIT6_LAT to HIT8_LAT as the respective latch hit signals HIT5_LAT1 to HIT7_LAT1, and deactivate the latch hit signals HIT4_LAT1 and HIT8_LAT1.

The second conversion unit 1223 may generate latch hit signals HIT1_LAT2 to HIT8_LAT2. When the second target active signal TRR_ACT2 is activated and the section signal TRR_EN is activated, the second conversion unit 1223 may transfer the latch hit signals HIT1_LAT to HIT3_LAT as the respective latch hit signals HIT2_LAT2 to HIT4_LAT2, transfer the latch hit signals HIT5_LAT to HIT7_LAT as the respective latch hit signals HIT6_LAT2 to HIT8_LAT2, and deactivate the latch hit signals HIT1_LAT2 and HIT5_LAT2. Furthermore, if the second target active signal TRR_ACT2 is activated when the section signal TRR_EN and the first detection signal LAST_WL_DET are activated, the second conversion unit 1123 may activate the latch hit signals HIT1_LAT2 and HIT5_LAT2.

When the section signal TRR_EN is deactivated, the hit signal transfer unit 1224 may transfer the hit signals HIT1 to HIT8 as the word line redundancy signals RED_WL1 to RED_WL8. The hit signal transfer unit 1224 may transfer the latch hit signals HIT1_LAT to HIT8_LAT as the word line redundancy signals RED_WL1 to RED_WL8 when the first target active signal TRR_ACT1 is activated, transfer the first latch hit signals HIT1_LAT1 to HIT8_LAT1 as the word line redundancy signals RED_WL1 to RED_WL8 when the second target active signal TRR_ACT2 is activated, and transfer the second latch hit signals HIT1_LAT2 to HIT8_LAT2 as the word line redundancy signals RED_WL1 to RED_WL8 when the third target active signal TRR_ACT3 is activated.

When section signal TRR_EN is deactivated, the redundancy signal generation unit 1225 may transfer the block hit signals BLK1_HIT and BLK2_HIT as the redundancy signals RED_BLK1 and RED_BLK2. When the latch signal TRR_LAT is activated and the section signal TRR_EN is activated, the redundancy signal generation unit 1225 may latch the block hit signals BLK1_HIT and BLK2_HIT and transfer the latched block hit signals BLK1_HIT and BLK2_HIT as the redundancy signals RED_BLK1 and RED_BLK2. When the second target active signal TRR_ACT2 is activated, the redundancy signal generation unit 1225 may transfer the latched block hit signals BLK1_HIT and BLK2_HIT as the redundancy signals RED_BLK1 and RED_BLK2 when the second detection signal FIRST_RWL_DET is deactivated, and may deactivate the redundancy signals RED_BLK1 and RED_BLK2 when the second detection signal FIRST_RWL_DET is activated. When the third target active signal TRR_ACT3 is activated, the redundancy signal generation unit 1225 may transfer the latched block hit signals BLK1_HIT and BLK2_HIT as the redundancy signals RED_BLK1 and RED_BLK2 when the first detection signal LAST_WL_DET is deactivated, and may activate the redundancy signals RED_BLK1 and RED_BLK2 when the first detection signal LAST_WL_DET is activated.

Figure 13:
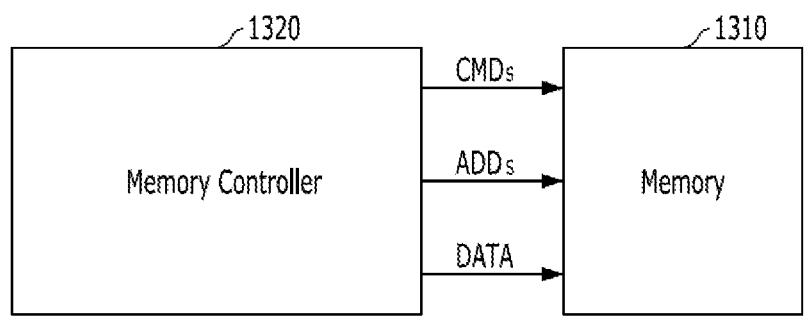
FIG. 13 is a block diagram illustrating a memory system in accordance with another exemplary embodiment according to the present invention.

FIG. 13 is a block diagram illustrates a memory system in accordance with another exemplary embodiment according to the present invention.

As shown in FIG. 13, the memory system may include memory 1310 and a memory controller 1320.

The memory controller 1320 controls an operation of the memory 1310 by applying commands CMDs and addresses ADDs to the memory 1310, and exchanges data DATA with the memory 1310 when read and write operations are performed. The memory controller 1320 may transmit the command signals CMDs to the memory 1310 so that the memory 1310 may generate a mode set command MODE_SET, an active command ACT, or a precharge command PRE based on the commands CMDs. When the mode set command MODE_SET is generated based on the command signals CMDs, The memory controller 1320 may transmit the addresses ADDS for setting an operation mode of the memory 1310 to the memory 1310. When the active command ACT is generated based on the command signals CMDs, the memory controller 1320 may transmit the addresses ADDs for selecting a cell block and a word line to be activated in the memory 1310.

The memory 1310 may detect an address of a frequently activated word line. The memory 1310 may detect the address of a frequently activated word line and output the detected address to the memory controller 1320. When the address of the frequently activated word line is received, the memory controller 1320 may control the memory 1310 so that the memory 1310 performs a target refresh operation.

If the frequently activated word line is defined as a word line which has the activation number equal to or greater than a reference number, the memory 1310 may count the activation number of a plurality of word lines and one or more redundancy word lines included in a cell block, detect a word line having the activation number equal to or greater than the reference number, and output an address of the detected word line as the address of the frequently activated word line.

If the frequently activated word line is defined as a word line which has an activation frequency equal to or greater than a reference frequency, the memory may store an activation active history, detect a word line that has been activated X times or higher (wherein "X" is a natural number) in each active operation Y (wherein "Y" is a natural number equal to or greater than "X") with reference to the activation history, and output an address of the detected word line as the address of the frequently activated word line. For example, the memory may detect a word line that has been activated twice or more whenever the memory performs an active operation five times during a specific section and output an address of the detected word line. The memory 1310 may detect a word line satisfying one of a condition that the activation number is equal to or greater than the reference number and a condition that activation frequency is equal to or greater than the reference frequency, as the frequently activated word line.

The memory controller 1320 may detect the address of a frequently activated word line using a method similar to the above method. If the memory controller 1320 detects the address of a frequently activated word line, the memory controller 1320 may control the memory 1310 without a need to output the detected address so that the memory 1310 performs a target refresh operation.

The memory 1310 may be implemented with one of the memory of FIG. 3 and the memory of FIGS. 9A to 9D, and may receive the command signals CMDs and the addresses ADDs. When the mode set command MODE_SET is generated based on the command signals CMDs, the memory 1310 may set an operation mode in response to the addresses ADDs, perform an active operation when the active command ACT is generated based on the command signals CMDs, and perform a precharge operation when the precharge command PRE is generated based on the command signals CMDs. Methods of the memory 1310 performing the mode setting operation, to the active and precharge operations, and the target refresh operation are identical to those described with reference to FIGS. 3 to 10. If read and write commands are received from the memory controller 1320, the memory 1310 exchanges data DATA with the memory controller 1320.

For reference, when a target refresh operation is performed, the sequence of adjacent word lines to be activated and the number of the adjacent word lines activated during a target refresh section may vary depending on the design. For example, if a $K^{th}$ word line is a frequently activated word line, a $(K+1)^{th}$ word line may be activated in the second active operation of the target refresh section and a $(K-1)^{th}$ word line may be activated in the third active operation of the target refresh section. The frequently activated word line does not need to be necessarily activated in the target refresh section. Furthermore, the number of word lines activated in the target refresh section may be smaller than 3 i.e., only one of a first adjacent word line and a second adjacent word line is activated, or greater than 3 i.e., the number of adjacent word lines is greater than 2 and the three or more adjacent word lines are refreshed during a refresh section.

Damage to memory cells coupled with a word line adjacent to a frequently activated word line is prevented by performing a target refresh operation on the word line adjacent to the frequently activated word line.

Furthermore, although a frequently activated word line is a redundancy word line that has replaced a normal word line, damage to memory cells coupled with a word line adjacent to the frequently activated word line may be prevented.

While the present invention has been described with respect to the specific embodiments, it will be apparent to those skilled in the art that various changes and modifications may be made without departing from the spirit and scope of the invention as defined in the following claims.

What is claimed is:
1. A memory comprising:
 a first cell block having a plurality of first word lines and one or more first redundancy word lines for replacing at least one of the plurality of first word lines;
 a second cell block having a plurality of second word lines and one or more second redundancy word lines for replacing at least one of the plurality of second word lines; and
 a control unit suitable for sequentially receiving two or more input addresses during a target refresh section, selecting one of the first cell block and the second cell block in response to a first input address during the target refresh section, and selecting a word line included in the selected cell block, and activating one or more adjacent word lines adjacent to the selected word line, which is selected based on the first input address, when the selected word line is adjacent to the redundancy word line, wherein the adjacent word lines comprise the redundancy word line.

2. The memory of claim 1, wherein
the selected word line is a normal word line selected based on the first input address when a word line corresponding to the first input address is not replaced, and
the selected word line is a redundancy word line replacing a word line corresponding to the first input address when the word line corresponding to the first input address is replaced by the redundancy word line.

3. The memory of claim 1, wherein
the plurality of first word lines is sequentially disposed in the first cell block, and the first redundancy word lines are sequentially disposed behind the first word line that is last disposed in the first cell block, and
the plurality of second word lines is sequentially disposed in the second cell block, and the second redundancy word lines are sequentially disposed behind the second word line that is last disposed in the second cell block.

4. The memory of claim 1, wherein
the input addresses comprise the first input address, a second input address that is second received, and a third input address that is third received,
the adjacent word lines comprise a first adjacent word line and a second adjacent word line, and
the control unit selects the first adjacent word line and the second adjacent word line in response to the second input address and the third input address when the selected word line is not adjacent to the redundancy word line.

5. The memory of claim 4, wherein, when the selected word line is last disposed in the selected cell block, the control unit activates one or more of the first adjacent word line and the second adjacent word line in the target refresh section, wherein the first adjacent word line is a word line disposed ahead of the word line last disposed in the selected cell block, and the second adjacent word line is a redundancy word line first disposed in the selected cell block.

6. The memory of claim 4, wherein, when the selected word line is replaced by a redundancy word line first disposed in the selected cell block, the control unit activates one or more of the first adjacent word line and the second adjacent word line in the target refresh section, wherein the first adjacent word line is a word line last disposed in the selected cell block, and the second adjacent word line is a redundancy word line disposed behind the redundancy word line first disposed in the selected cell block.

7. The memory of claim 4, wherein, when the selected word line is a redundancy word line other than a redundancy word line first disposed in the selected cell block, the control unit activates one or more of the first adjacent word line and the second adjacent word line in the target refresh section, wherein the first adjacent word line is a redundancy word line disposed ahead of the redundancy word line replacing the selected word line, and the second adjacent word line is a redundancy word line disposed behind the redundancy word line replacing the selected word line.

8. The memory of claim 1, wherein the control unit terminates the target refresh section after activating the adjacent word lines.

9. The memory of claim 4, wherein the control unit comprises a cell block selection unit suitable for selecting one of the first cell block and the second cell block in response to the input addresses, wherein the cell block selection unit selects a cell block in response to the first input address during the target refresh section.

10. The memory of claim 4, wherein the control unit comprises a hit signal generation unit suitable for generating a plurality of hit signals corresponding to the first and second redundancy word lines, wherein the hit signal generation unit activates a hit signal corresponding to a redundancy word line replacing the selected word line.

11. The memory of claim 10, wherein the control unit comprises a target refresh control unit suitable for activating a first detection signal when the selected word line is last disposed in the selected cell block, and activating a second detection signal when the selected word line is a redundancy word line first disposed in the selected cell block.

12. The memory of claim 11, wherein the control unit comprises a word line control signal generation unit suitable for generating an address signal and a plurality of redundancy word line signals corresponding to the first and the second redundancy word lines in response to the input addresses, the plurality of hit signals, the first detection signal, and the second detection signal.

13. The memory of claim 12, wherein
the word line control signal generation unit transfers the input addresses as the address signal, and outputs an address value corresponding to a word line last disposed in the selected cell block when the second detection signal is activated, and
the word line control signal generation unit activates a redundancy word line signal corresponding to the activated hit signal, from among the plurality of redundancy word line signals, and in the target refresh section, sequentially activates redundancy word line signals corresponding to redundancy word lines that are adjacent to a redundancy word line corresponding to the activated redundancy word line signal, and activates a redundancy word line signal corresponding to a redundancy word line first disposed in the selected cell block when the first detection signal is activated.

14. The memory of claim 13, wherein the control unit comprises:
a first word line control unit corresponding to the first cell block, suitable for activating a first word line corresponding to the address signal or a first redundancy word line corresponding to the activated redundancy word line signal when the first cell block is selected; and
a second word line control unit corresponding to the second cell block, suitable for activating a second word line corresponding to the address signal or a second redundancy word line corresponding to the activated redundancy word line signal when the second cell block is selected.

15. A memory system comprising:
a memory having a first cell block including a plurality of first word lines and one or more first redundancy word lines, and a second cell block including a plurality of second word lines and one or more second redundancy word lines, suitable for selecting one of the first and second cell blocks in response to a first input address during a target refresh section, and selecting a word line included in the selected cell block, and activating one or more adjacent word lines adjacent to the selected word line, which is selected based on the first input address, in the selected cell block when the selected word line is adjacent to the redundancy word line, wherein the adjacent word lines comprise the redundancy word line; and
a memory controller suitable for controlling the memory to enter the target refresh section when a word line on which target refresh is to be performed is detected, and transmitting two or more addresses for selecting the word line on which target refresh is to be performed to the memory during the target refresh section.

16. The memory system of claim 15, wherein
the selected word line is a normal word line selected based on the first input address when a word line corresponding to the first input address is not replaced, and
the selected word line is a redundancy word line replacing a word line corresponding to the first input address when the word line corresponding to the first input address is replaced by the redundancy word line.

17. The memory system of claim 15, wherein
the addresses comprise the first input address, a second input address that is second received, and a third input address that is third received,
the adjacent word lines comprise a first adjacent word line and a second adjacent word line, and
the memory selects the first adjacent word line and the second adjacent word line in response to the second input address and the third input address when the selected word line is not adjacent to the redundancy word line.

18. The memory system of claim 17, wherein, when the selected word line is last disposed in the selected cell block, the memory activates one or more of the first adjacent word line and the second adjacent word line in the target refresh section, wherein the first adjacent word line is a word line disposed ahead of the word line last disposed in the selected cell block, and the second adjacent word line is a redundancy word line first disposed in the selected cell block.

19. The memory system of claim 17, wherein, when the selected word line is a redundancy word line first disposed in the selected cell block, the memory activates one or more of the first adjacent word line and the second adjacent word line in the target refresh section, wherein the first adjacent word line is a word line last disposed in the selected cell block, and the second adjacent word line is a redundancy word line disposed behind the redundancy word line first disposed in the selected cell block.

20. The memory system of claim 19, wherein, when the selected word line is a redundancy word line other than a redundancy word line first disposed in the selected cell block, the memory activates one or more of the first adjacent word line and the second adjacent word line in the target refresh section, wherein the first adjacent word line is a redundancy word line disposed ahead of the redundancy word line replacing the selected word line, and the second adjacent word line is a redundancy word line disposed behind the redundancy word line replacing the selected word line.

21. A memory comprising:
a first cell block having a plurality of first word line groups and one or more first redundancy word line groups replacing at least one of the plurality of first word line groups, wherein each of the first word line groups comprises two or more first word lines, and each of the first redundancy word line groups comprises two or more first redundancy word lines;
a second cell block having a plurality of second word line groups and one or more second redundancy word line groups replacing at least one of the plurality of second word line groups, wherein each of the second word line groups comprises two or more first word lines, and each of the second redundancy word line groups comprises two or more first redundancy word lines; and
a control unit suitable for sequentially receiving two or more input addresses during a target refresh section, selecting one of the first cell block and the second cell block in response to a first input address during a target refresh section, and selecting a word line included in the selected cell block, and activating one or more adjacent word lines adjacent to the selected word line, which is selected based on the first input address, when the selected word line is adjacent to the redundancy word line during the target refresh section, wherein the adjacent word lines comprise the redundancy word line.

22. The memory of claim 21, wherein
the selected word line is a normal word line selected based on the first input address when a word line corresponding to the first input address is not replaced, and
the selected word line is a redundancy word line replacing a word line corresponding to the first input address when the word line corresponding to the first input address is replaced by the redundancy word line.

23. The memory of claim 22, wherein
the plurality of first word line groups is sequentially disposed in the first cell block, and the first redundancy word line groups are sequentially disposed behind the first word line group that is last disposed in the first cell block, and
the plurality of second word line groups is sequentially disposed in the second cell block, and the second redundancy word line groups are sequentially disposed behind the second word line group that is last disposed in the second cell block.

24. The memory of claim 22, wherein
the input addresses comprise the first input address, a second input address that is second received, and a third input address that is third received,
the one or more adjacent word lines comprise a first adjacent word line and a second adjacent word line, and
the control unit selects the first adjacent word line and the second adjacent word line in response to the second input address and the third input address when the selected word line is not adjacent to the redundancy word line.

25. The memory of claim 24, wherein, when the selected word line is last disposed in the selected cell block, the control unit activates one or more of the first adjacent word line and the second adjacent word line in the target refresh section, wherein the first adjacent word line is a word line disposed ahead of the word line last disposed in the selected cell block, and the second adjacent word line is a redundancy word line first disposed in the selected cell block.

26. The memory of claim 24, wherein, when the selected word line is replaced by a redundancy word line first disposed in the selected cell block, the control unit activates one or more of the first adjacent word line and the second adjacent word line in the target refresh section, wherein the first adjacent word line is a word line last disposed in the selected cell block, and the second adjacent word line is a redundancy word line disposed behind the redundancy word line first disposed in the selected cell block.

27. The memory of claim 24, wherein, when the selected word line is a redundancy word line other than a redundancy word line first disposed in the selected cell block, the control unit activates one or more of the first adjacent word line and the second adjacent word line in the target refresh section, wherein the first adjacent word line is a redundancy word line disposed ahead of the redundancy word line replacing the selected word line, and the second adjacent word line is a redundancy word line disposed behind the redundancy word line replacing the selected word line.

28. The memory of claim 24, wherein the control unit terminates the target refresh section after activating the adjacent word lines.

\* \* \* \* \*